(12) United States Patent
Liaw

(10) Patent No.: US 12,267,991 B2
(45) Date of Patent: Apr. 1, 2025

(54) MULTI-GATE FIELD-EFFECT TRANSISTORS IN INTEGRATED CIRCUITS

(71) Applicant: Taiwan Semiconductor Manufacturing Company, Ltd., Hsin-Chu (TW)

(72) Inventor: Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 588 days.

(21) Appl. No.: 17/399,748

(22) Filed: Aug. 11, 2021

(65) Prior Publication Data
US 2023/0052883 A1    Feb. 16, 2023

(51) Int. Cl.
| | |
|---|---|
| H10B 10/00 | (2023.01) |
| G11C 11/412 | (2006.01) |
| H01L 23/538 | (2006.01) |
| H01L 27/088 | (2006.01) |
| H01L 29/78 | (2006.01) |

(52) U.S. Cl.
CPC ............ *H10B 10/12* (2023.02); *G11C 11/412* (2013.01); *H01L 23/5384* (2013.01); *H01L 27/0886* (2013.01); *H01L 29/785* (2013.01); *H01L 2029/7858* (2013.01)

(58) Field of Classification Search
CPC . G11C 11/412; H01L 27/0886; H01L 29/785; H01L 29/0673; H01L 29/66439; H01L 29/775; H10B 10/12
See application file for complete search history.

(56) References Cited

U.S. PATENT DOCUMENTS

| | | |
|---|---|---|
| 7,269,056 B1 | 9/2007 | Liaw |
| 7,365,432 B2 | 4/2008 | Liaw |
| 8,947,902 B2 | 2/2015 | Liaw |
| 2020/0043935 A1* | 2/2020 | Liaw ..................... H01L 29/785 |
| 2020/0287020 A1* | 9/2020 | Seo .................. H01L 29/78696 |

\* cited by examiner

*Primary Examiner* — Tuan A Hoang
(74) *Attorney, Agent, or Firm* — Cooper Legal Group, LLC

(57) ABSTRACT

An IC structure includes a first SRAM cell and a second SRAM, where a layout of the second SRAM cell is a mirror image of that of the first SRAM cell about a vertical cell boundary therebetween. The first SRAM cell includes a first PD device and a second PD device disposed over a first fin and a second fin, respectively, where a portion of the first fin and a portion of the second fin corresponding to a channel region of the first and the second PD devices, respectively, each include a first stack of semiconductor layers defined by a channel width W1, a portion of the first fin and a portion of the second fin providing a source terminal of the first and the second PD devices, respectively, are each defined by a width W1' that is enlarged with respect to the channel width W1.

20 Claims, 26 Drawing Sheets

MULTI-GATE FIELD-EFFECT TRANSISTORS IN INTEGRATED CIRCUITS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, multi-gate transistors, such as gate-all-around (GAA) transistors, have been incorporated into memory devices (including, for example, static random-access memory, or SRAM, cells) to reduce chip footprint while maintaining reasonable processing margins. Although existing technologies for fabricating GAA transistors have been generally adequate for their intended purposes, they have not been entirely satisfactory in all aspects. For example, reduction in cell dimensions (e.g., gate pitch) has led to reduced landing area for device-level contacts at various nodes (e.g., $CV_{SS}$ nodes), causing potential increase in contact resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
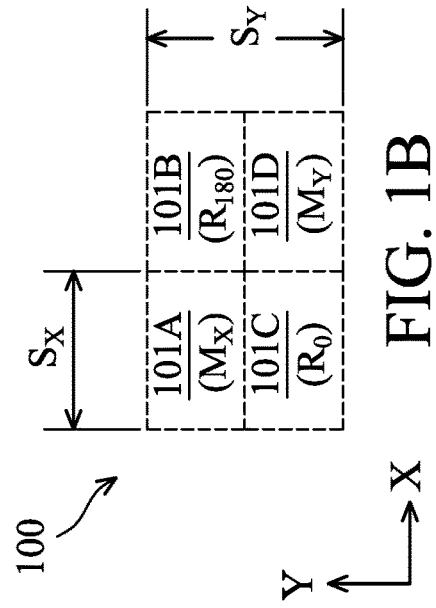
FIGS. 1B and 1C are diagrammatic plan views of an array of SRAM cells, in portion or entirety, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional gate-all-around (GAA) FETs, in memory and/or standard logic cells of an integrated circuit (IC) structure. Generally, a GAA FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. While existing technologies for fabricating GAA FETs have been generally adequate for their intended applications, they have not been entirely satisfactory in all aspects. The present disclosure includes multiple embodiments. Different embodiments may have different advantages, and no particular advantage is necessarily required of any embodiment.

Figure 1C:
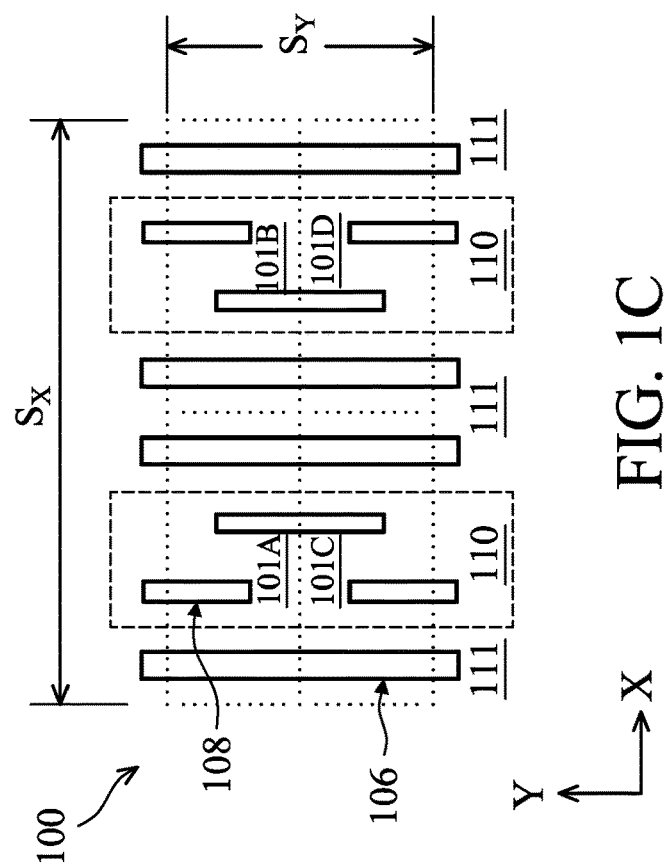
Figure 1A:
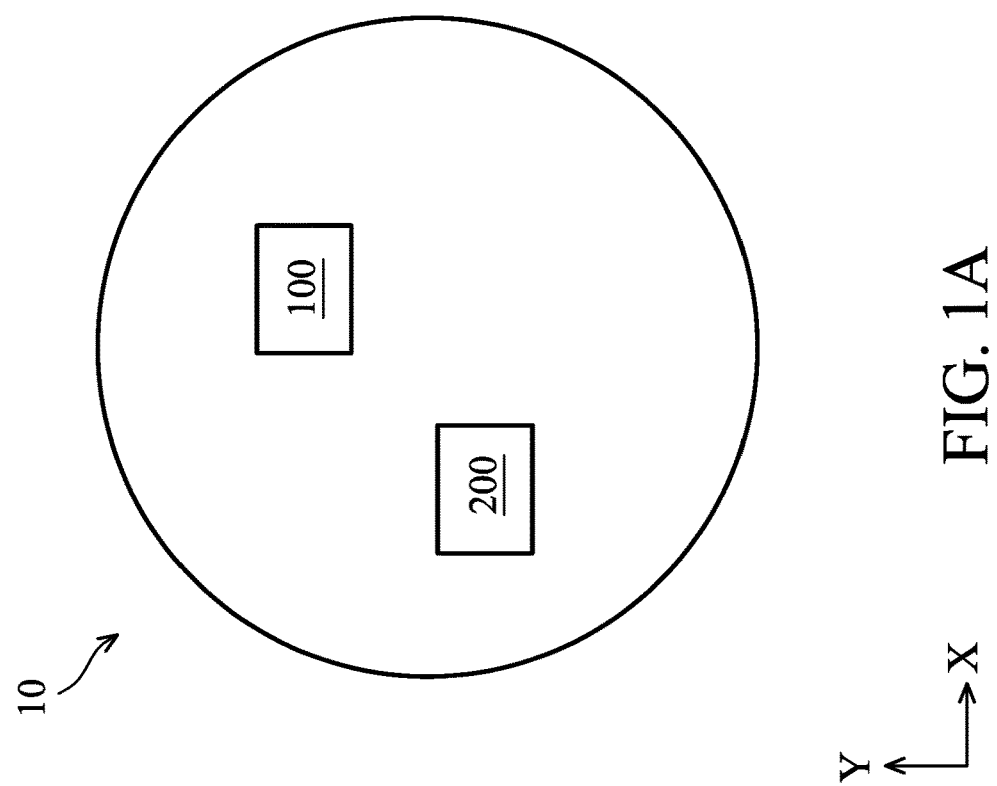
FIG. 1A is a diagrammatic plan view of an IC chip, in portion or entirety, according to various aspects of the present disclosure.

Referring to FIG. 1A, the present disclosure provides an IC structure 10 formed over a semiconductor substrate and includes at least an array 100 of memory cells. The array 100 may include static random-access memory (SRAM) cells, dynamic random-access memory (DRAM) cells, non-volatile random-access memory (NVRAM) cells, flash memory cells, other suitable memory cells, or combinations thereof. The IC structure 10 may further include a plurality of other components, such as an array 200 of standard logic (STD) cells configured to provide various standard logic devices, such as inverter, AND, NAND, OR, XOR, NOR, other suitable devices, or combinations thereof. Additionally, the IC structure 10 may include various passive and active microelectronic devices, such as resistors, capacitors, inductors, diodes, bipolar transistors, high voltage transistors, high frequency transistors, other suitable devices, or combinations thereof. Additional features can be added to the IC structure 10 and some of the features described below can be replaced, modified, or eliminated in other embodiments of the IC structure 10.

In the present embodiments, referring to FIG. 1B, the array 100 includes a plurality of SRAM cells 101A, 101B, 101C, and 101D, which generally provide memory or storage capable of retaining data when power is applied. As such, the array 100 is hereafter referred to as SRAM array 100. In the present embodiments, each SRAM cell 101A-101D includes one or more GAA FETs to be discussed in detail below.

In the present embodiments, still referring to FIG. 1B, the SRAM cells 101A, 101B, 101C, and 101D, together defining a two-by-two grid, exhibit mirror and/or rotational symmetry with respect to each other. For example, using the SRAM cell 101C as a reference (denoted "$R_0$"), a layout of the SRAM cell 101A (denoted "$M_x$") is a mirror image of a layout of the SRAM cell 101C with respect to the X-axis. Similarly, a layout of the SRAM cell 101B is a mirror image of the layout of the SRAM cell 101A, and a layout of the SRAM cell 101D (denoted "$M_y$") is a mirror image of the layout of the SRAM cell 101C, both with respect to the Y-axis. In other words, the layout of the SRAM cell 101B (denoted "$R_{180}$") is symmetric to the layout of the SRAM 101C by a rotation of 180 degrees about a geometric center of the grid, which is defined as an intersection point of an imaginary line bisecting the rectangular grid along the Y-axis and an imaginary line bisecting the rectangular grid along the X-axis. Furthermore, in the depicted embodiments, the SRAM cells 101A-101D are substantially the same in size, i.e., having substantially the same horizontal (long) pitch $S_x$ along the X-axis and a vertical (short) pitch $S_y$ along the Y-axis. As such, each SRAM cells 101A-101D may hereafter be referred to as the SRAM cell 101 for purposes of simplicity.

Referring to FIG. 1C, each SRAM cell 101 is configured to include p-type three-dimensional fin-like active regions 106 (hereafter referred to as p-type fins 106) each disposed in a p-type doped region 111 (hereafter referred to as p-well 111) and n-type three-dimensional fin-like active regions 108 (hereafter referred to as n-type fins 108) each disposed in an n-type doped region 110 (hereafter referred to as n-well 110), which is interposed between two p-wells 111. The p-type fins 106 and the n-type fins 108 are oriented lengthwise along Y-axis and spaced from each other along X-axis, which is substantially perpendicular to the Y-axis. As will be discussed in detail below, each p-type fin 106 includes a first set of vertically stacked semiconductor layers configured to provide channel regions of n-type GAA FETs, and each n-type fin 108 includes a second set of vertically stacked semiconductor layers configured to provide channel regions of p-type GAA FETs. The second set of vertically stacked semiconductor layers may differ from the first set of vertically stacked semiconductor layers in at least one dimension along the X-axis. In other words, a channel length of the n-type GAA FETs may differ from a channel length of the p-type GAA FETs. Various SRAM cells 101 may be configured for similar applications, such as a high-speed application, a low-power application, a super high-speed application, other suitable applications, or combinations thereof. Alternatively, different SRAM cells 101 may be configured for different applications and designed with different specifications (e.g., dimensions, layout designs, etc.) accordingly.

Figure 4A:
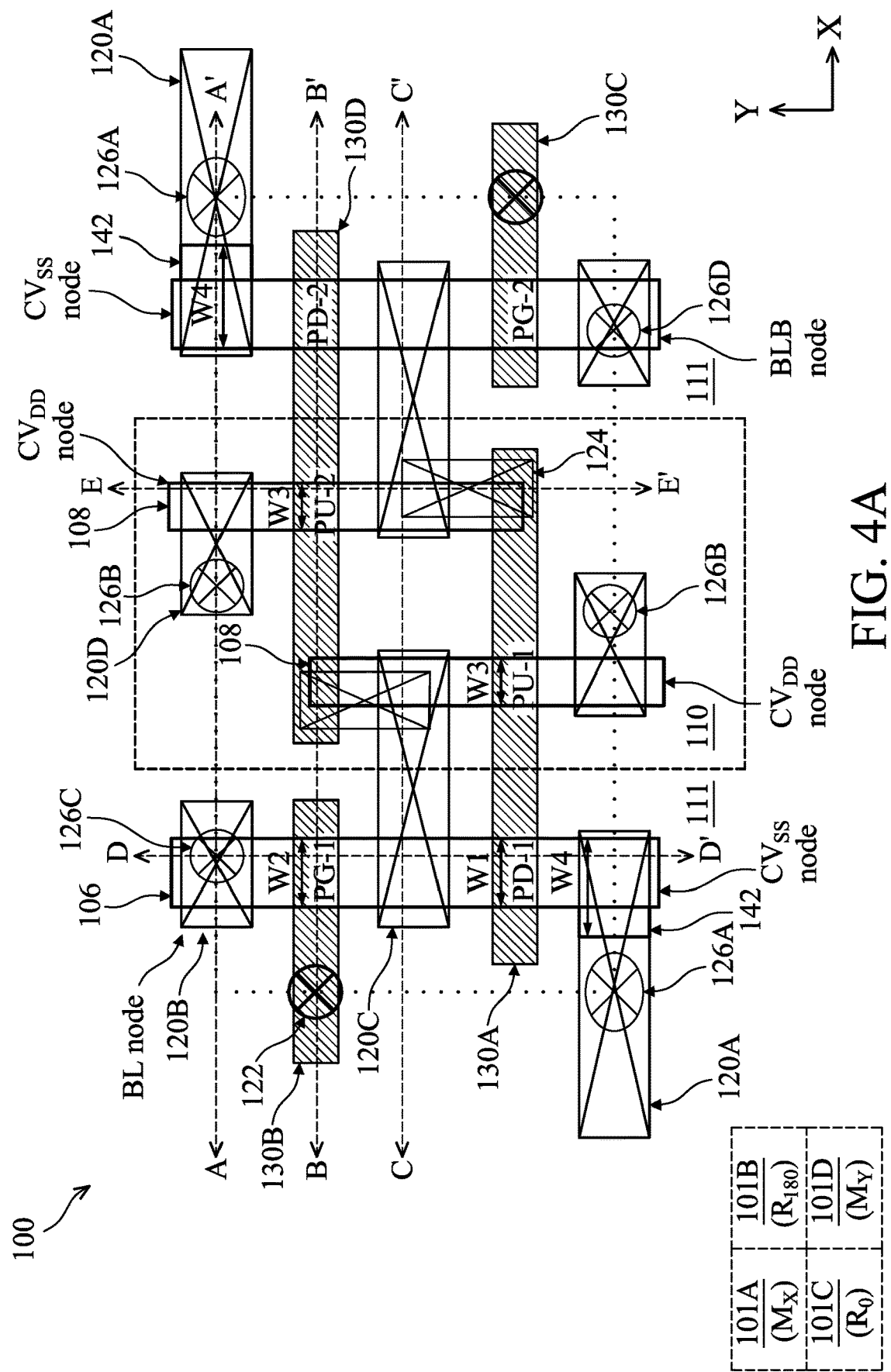
Figure 4B:
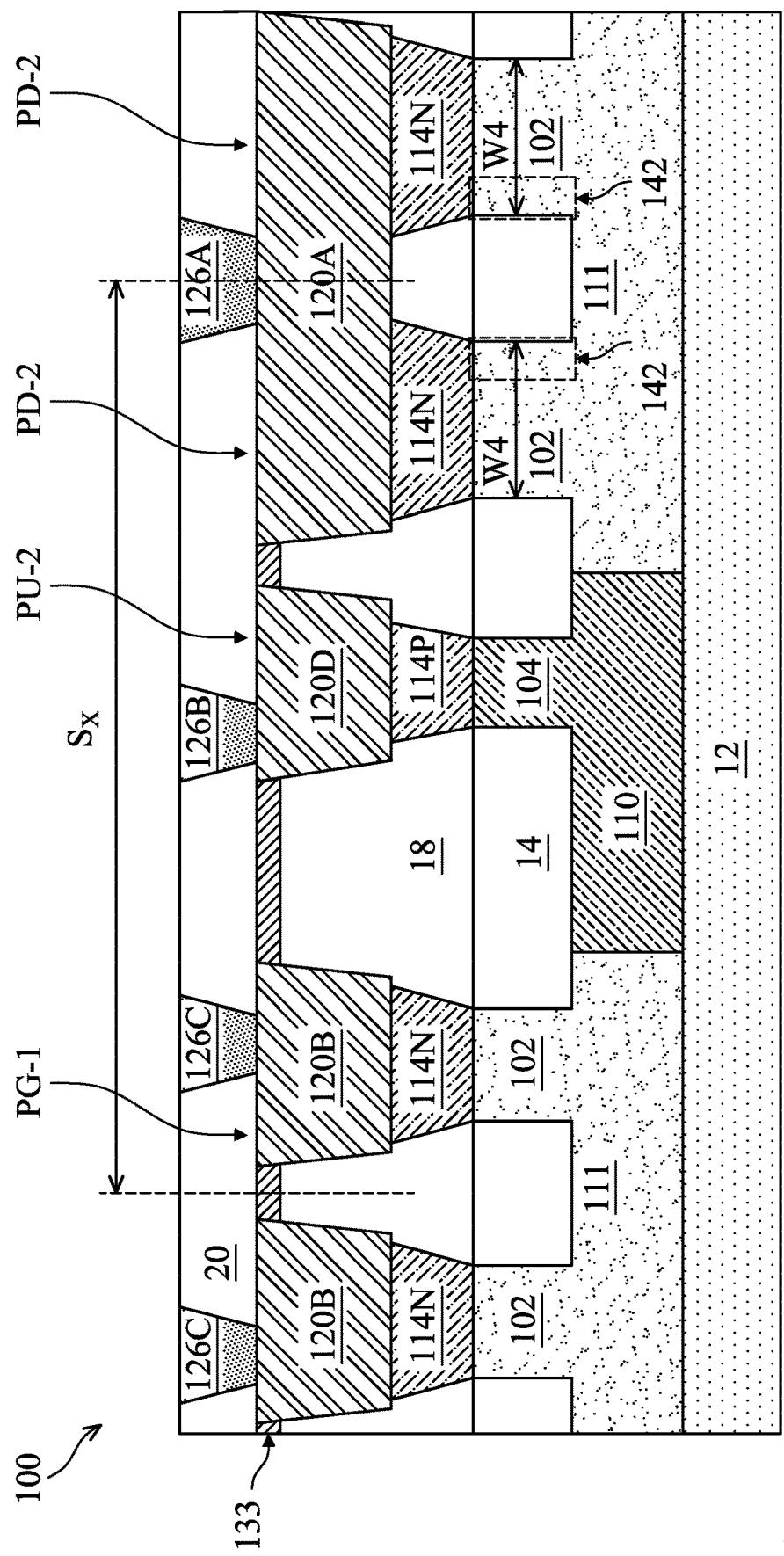
FIGS. 4B, 4C, 4D, 4E, and 4F are cross-sectional views, in portion or entirety, of the IC structure taken along lines AA', BB', CC', DD', and EE', respectively, of FIG. 4A according to various aspects of the present disclosure.
Figure 7A:
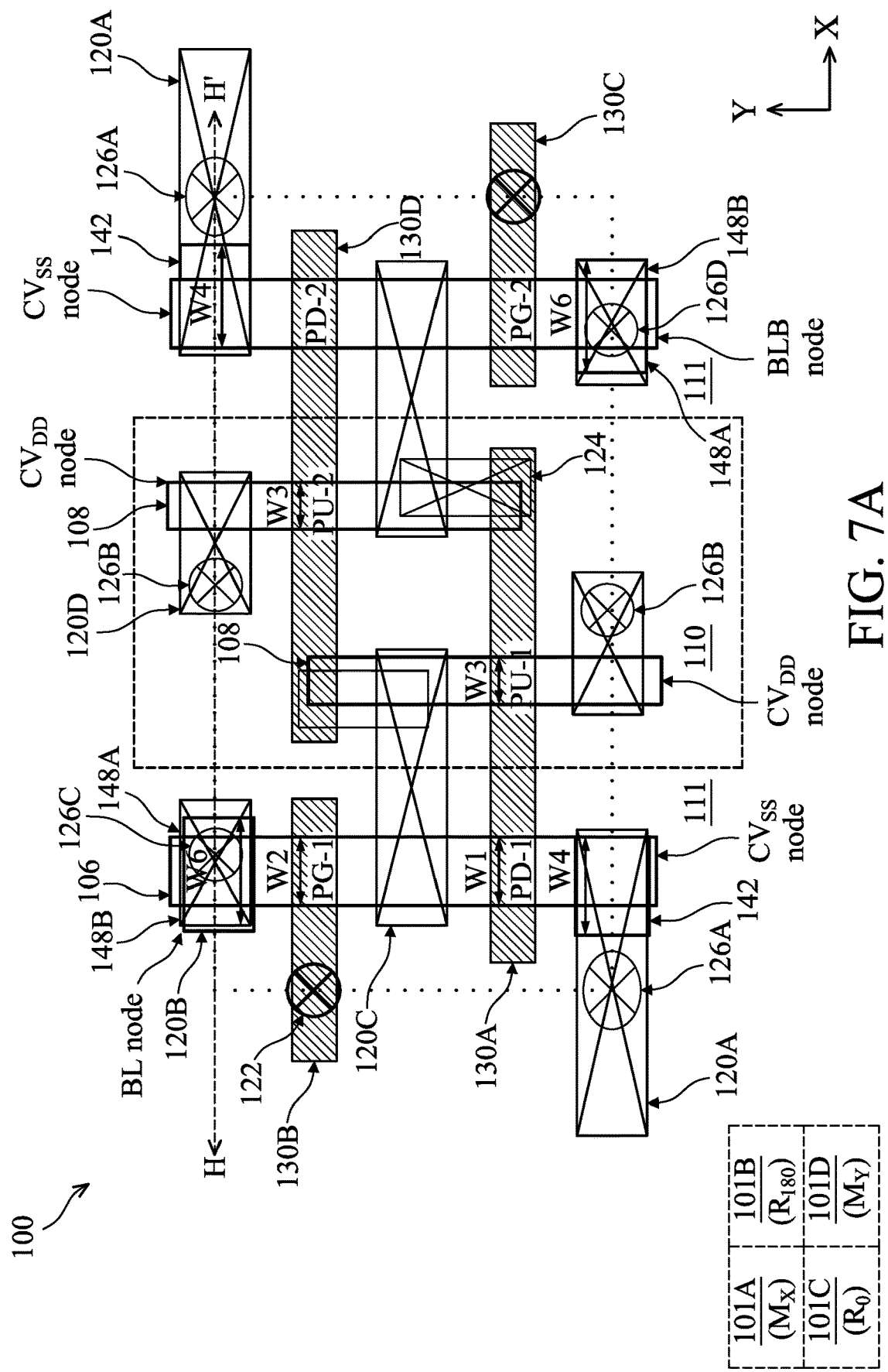
Figure 7B:
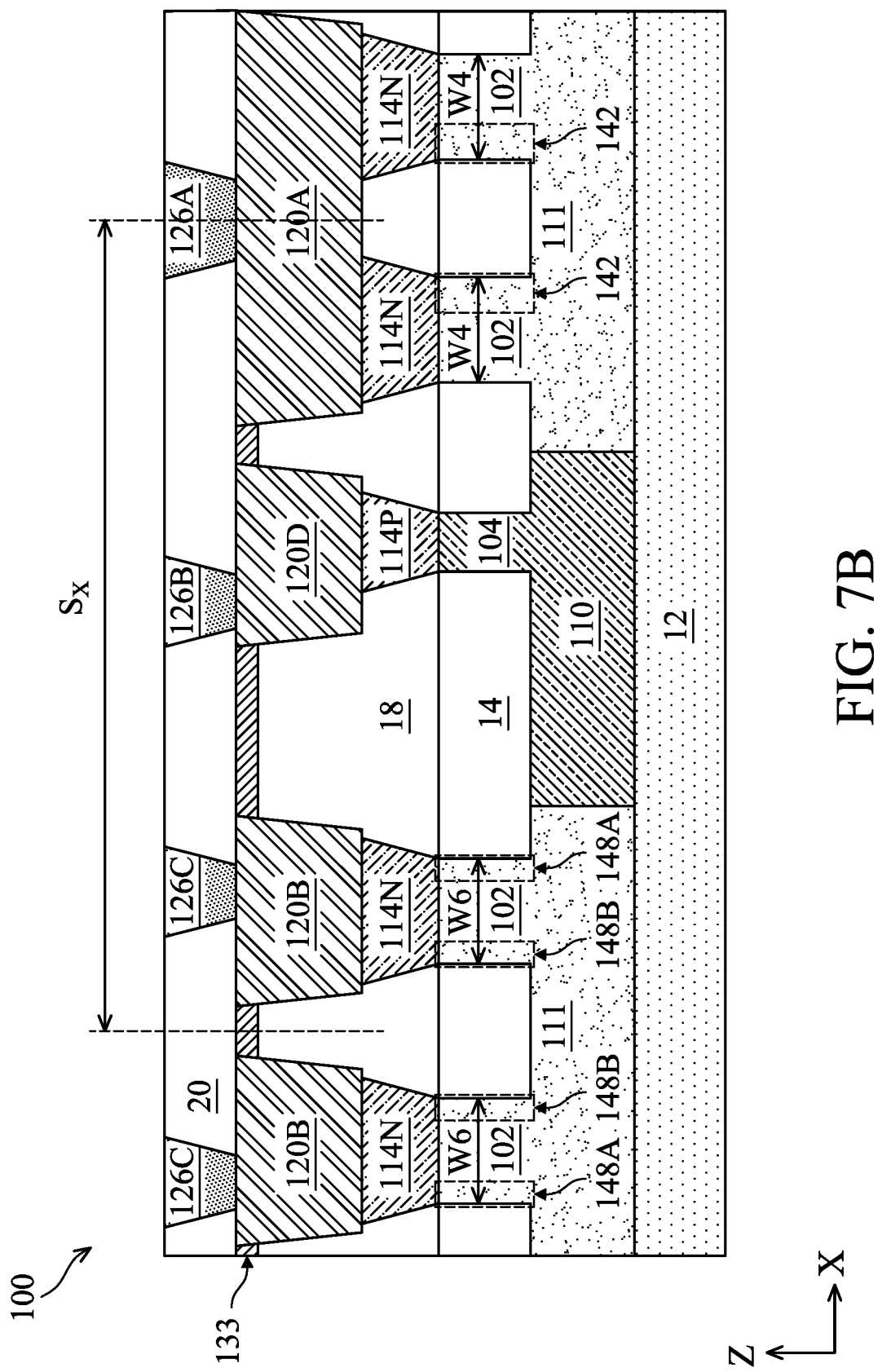
FIG. 7B is a cross-sectional view, in portion or entirety, of the IC structure taken along line HH' of FIG. 7A according to various aspects of the present disclosure.
Figure 8A:
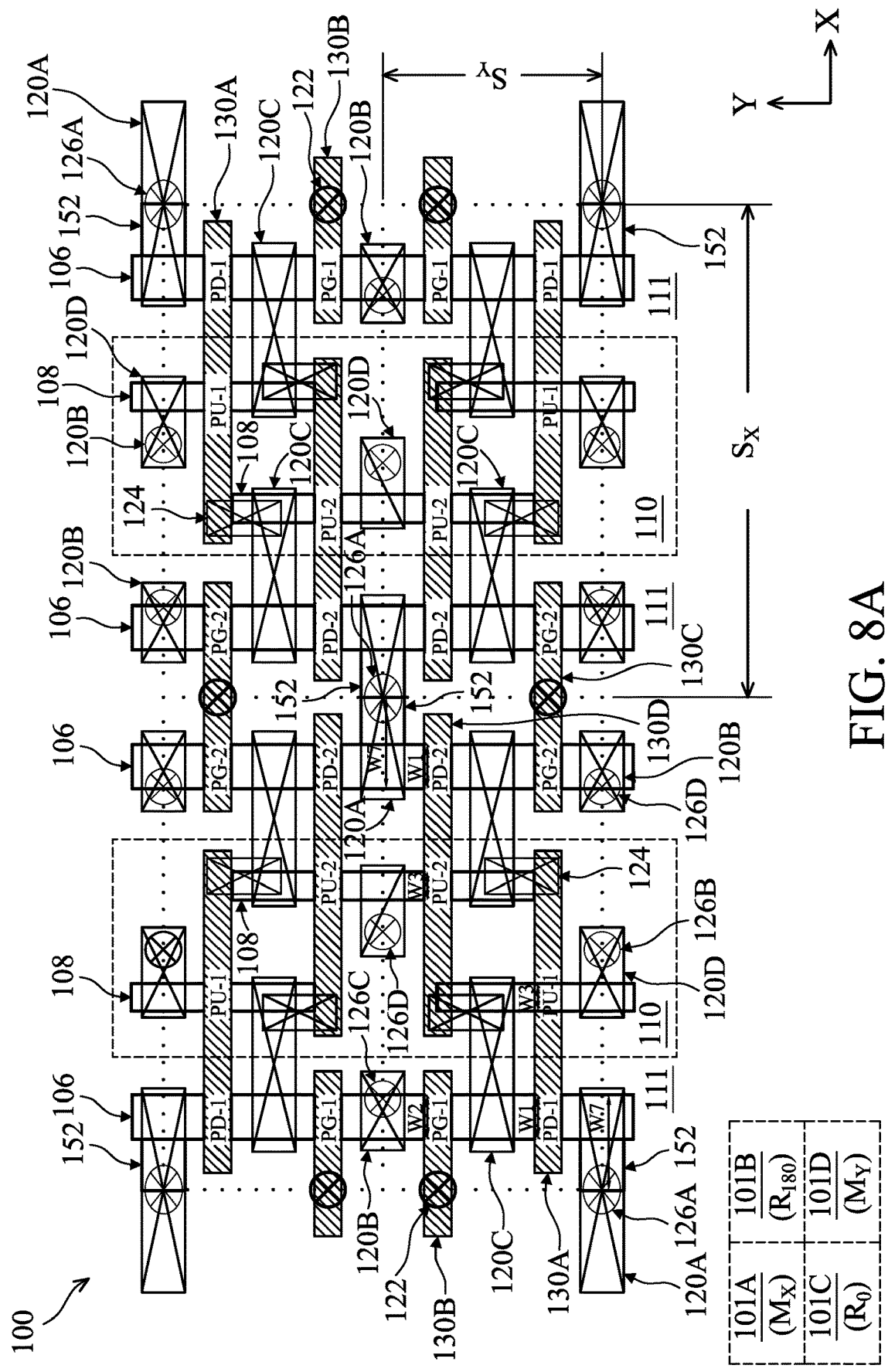
Figure 8B:
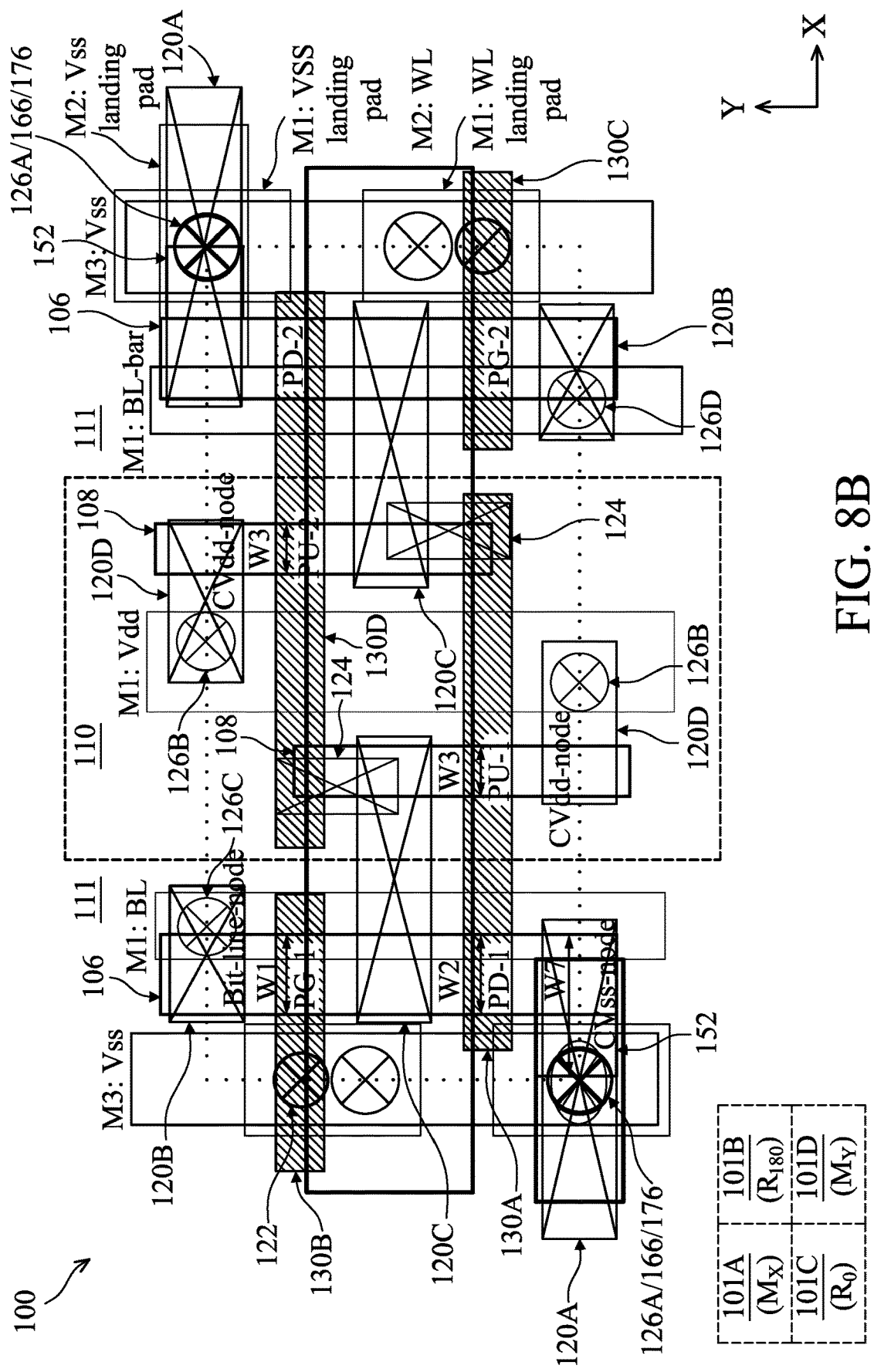
Figure 9A:
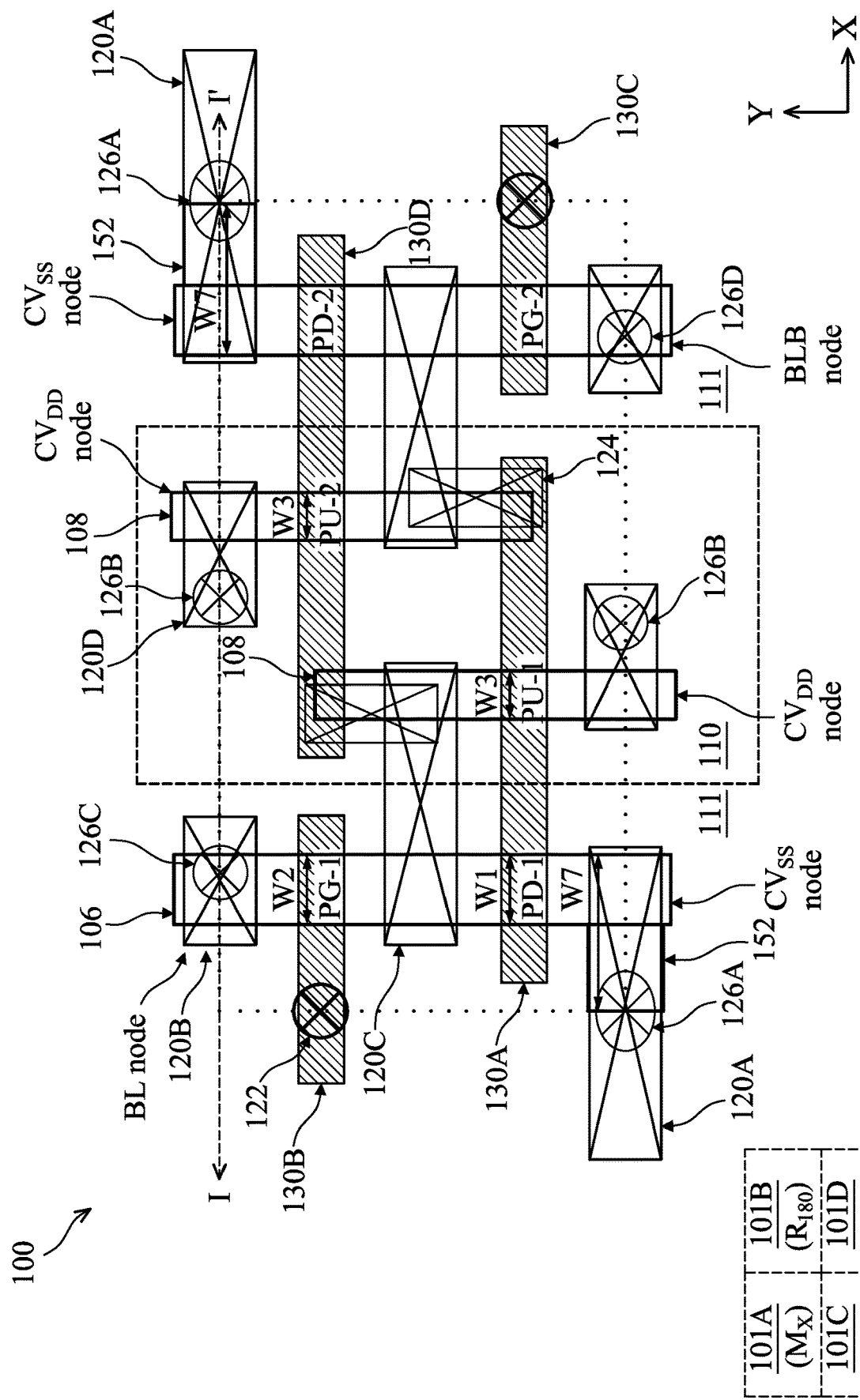
Figure 9B:
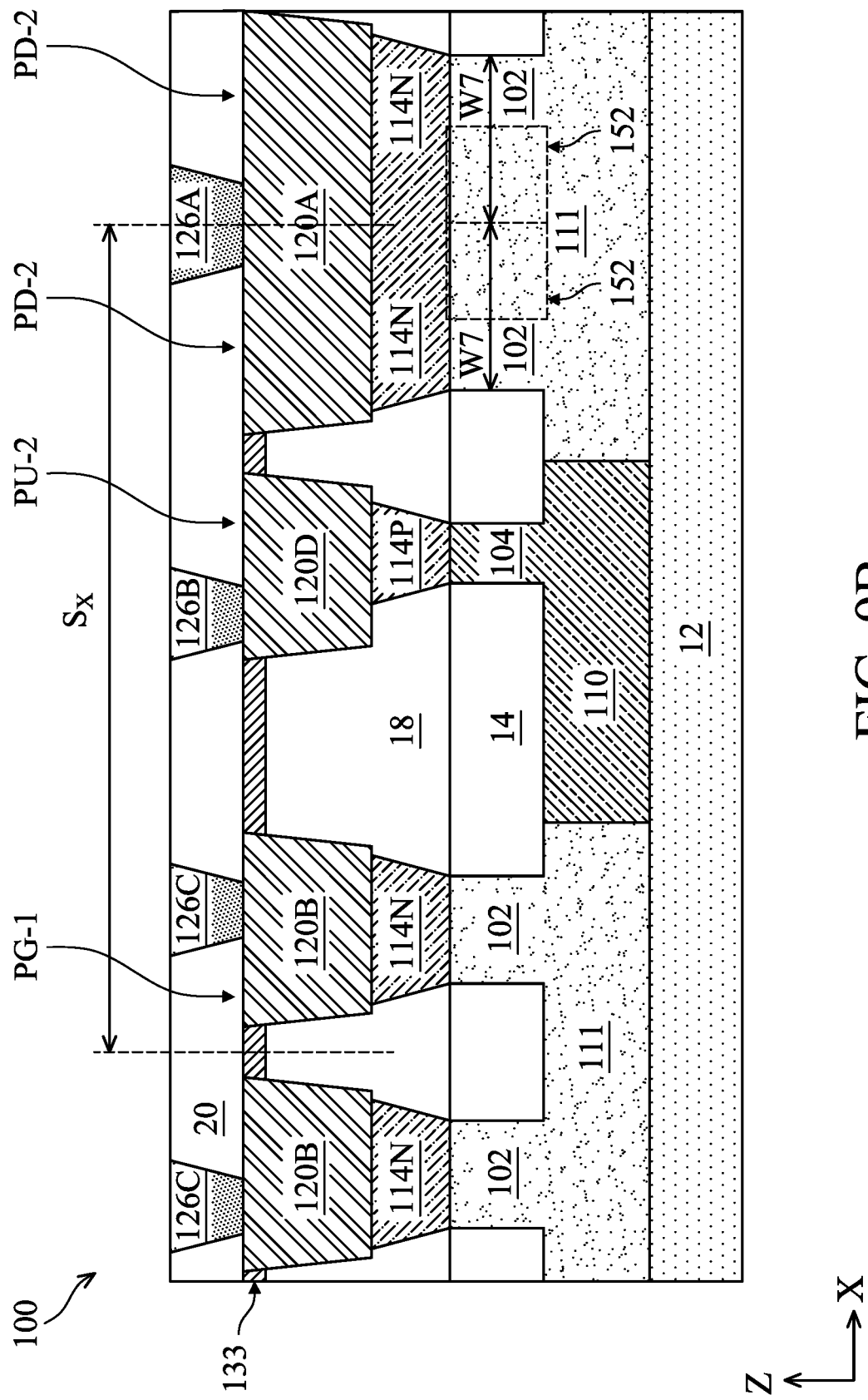
FIG. 9B is a cross-sectional view, in portion or entirety, of the IC structure taken along line II' of FIG. 9A according to various aspects of the present disclosure.
Figure 11A:
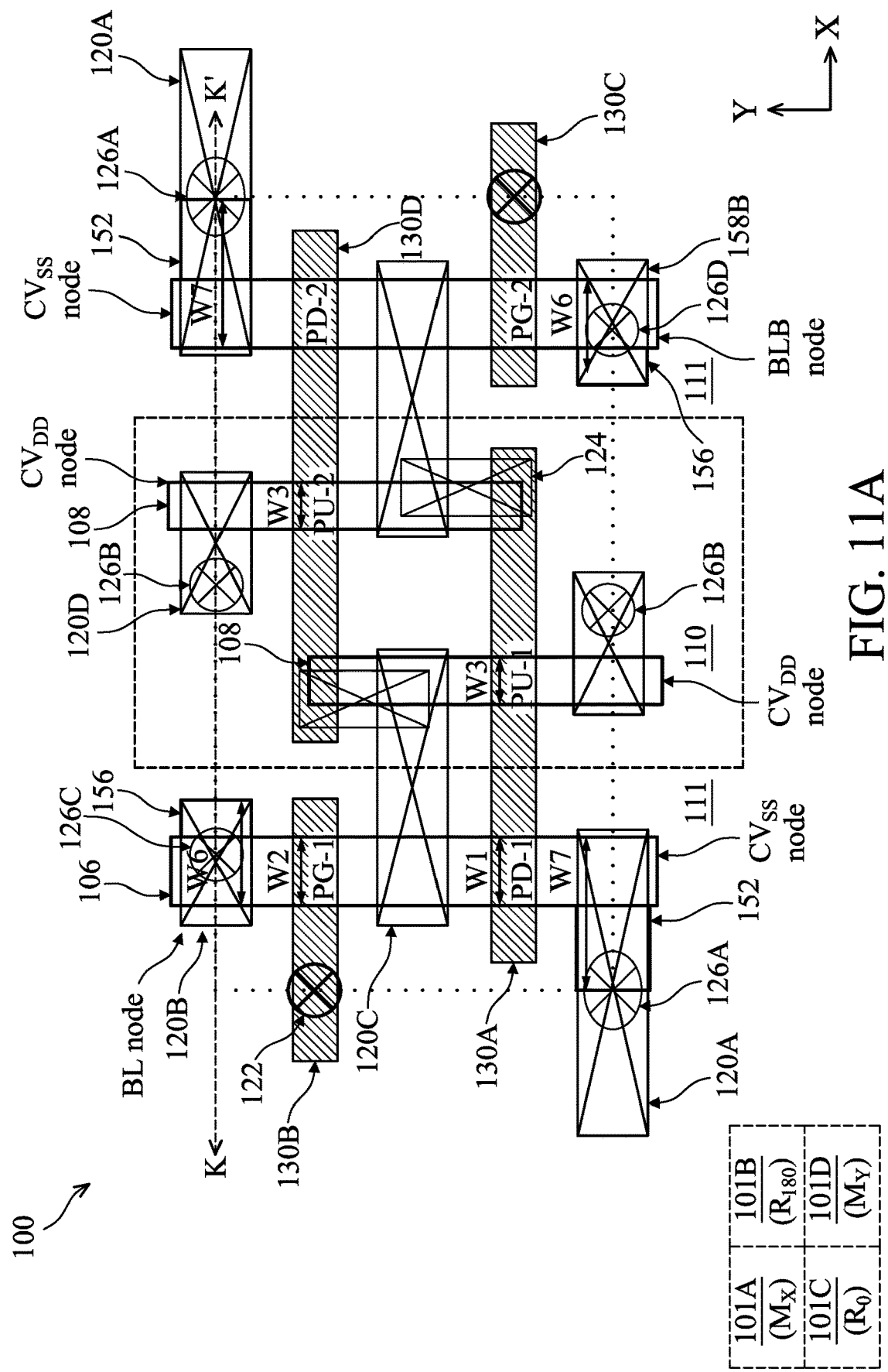
Figure 11B:
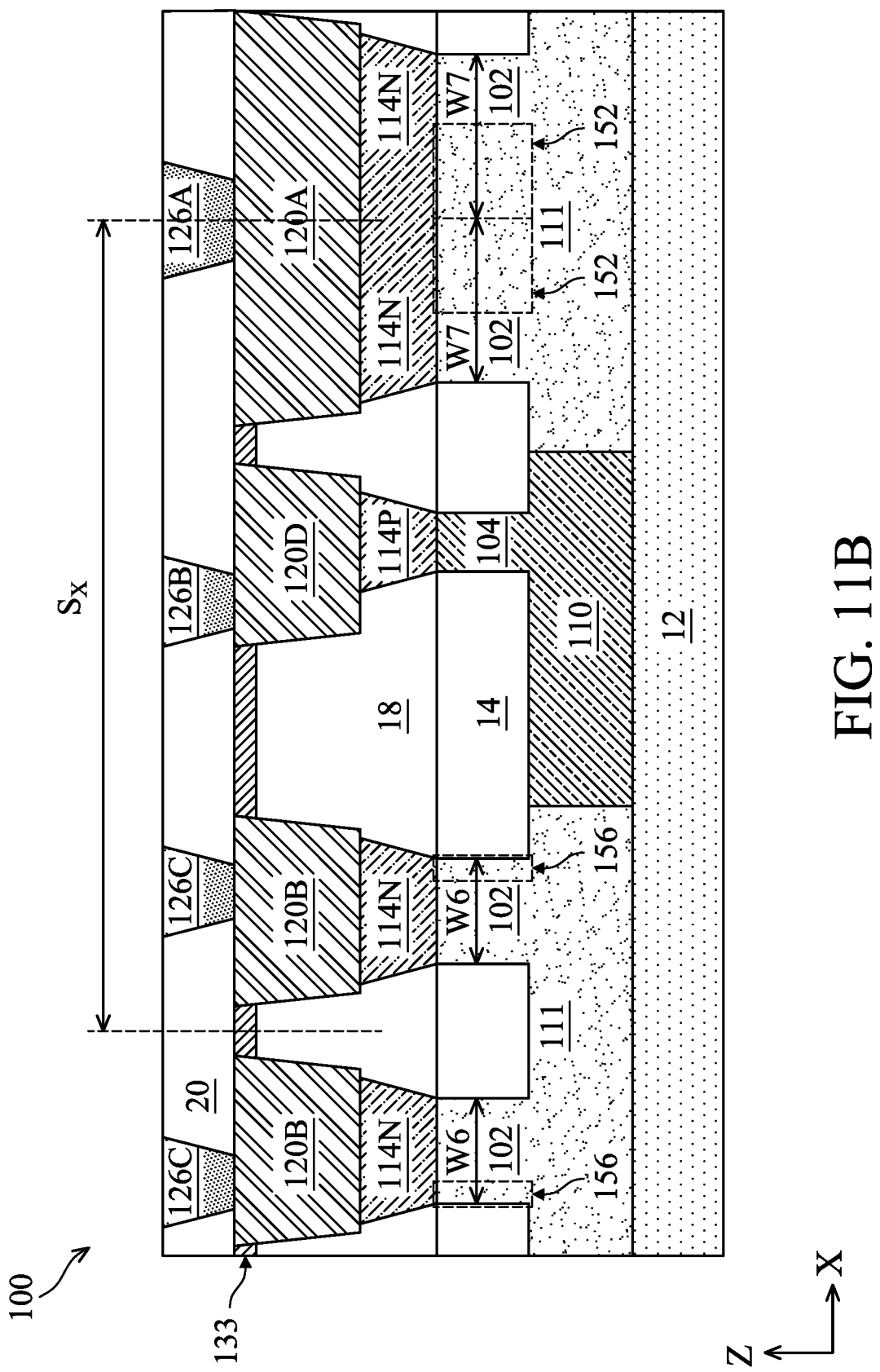
FIG. 11B is a cross-sectional view, in portion or entirety, of the IC structure taken along line KK' of FIG. 11A according to various aspects of the present disclosure.
Figure 12A:
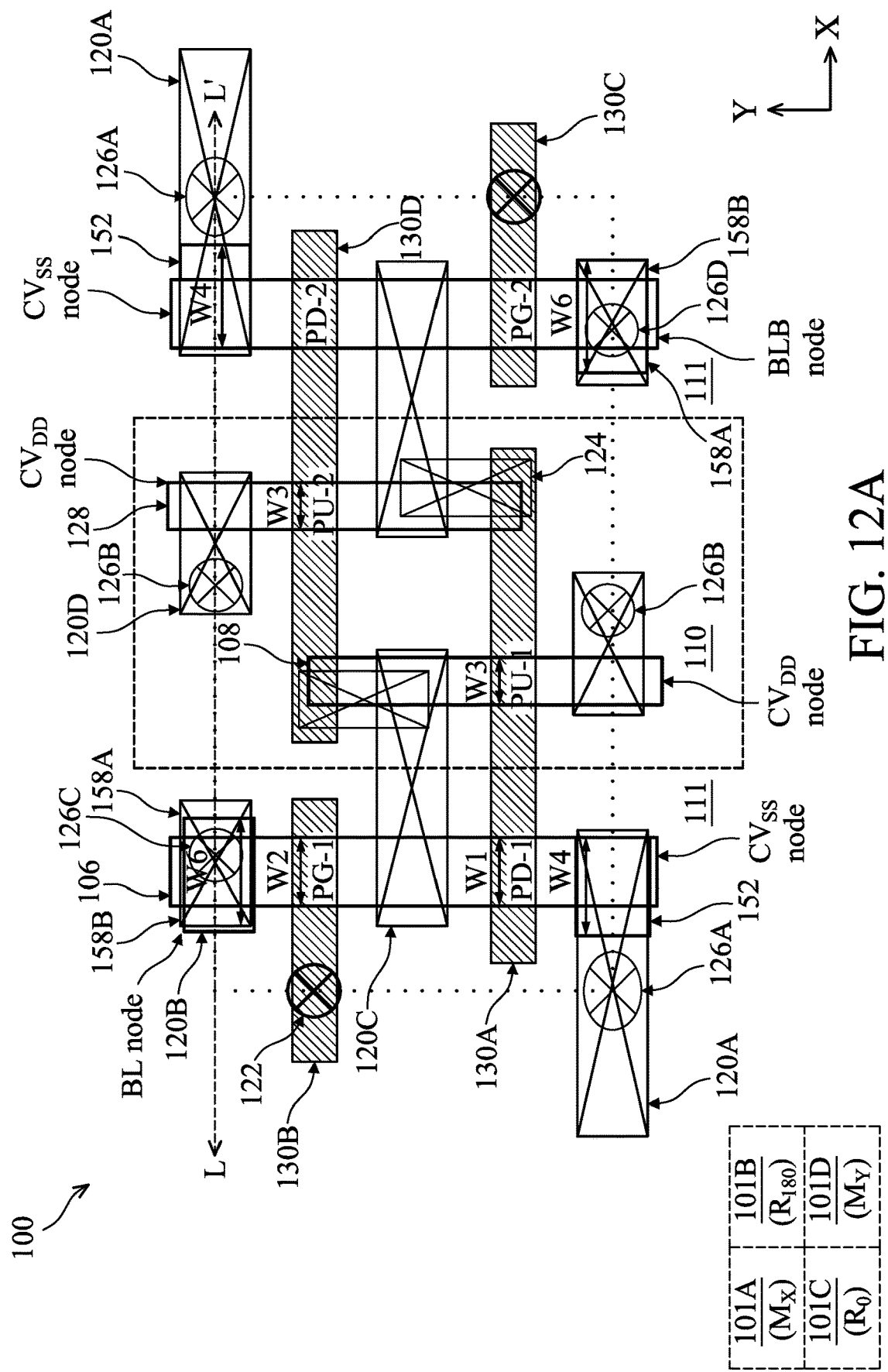
Figure 12B:
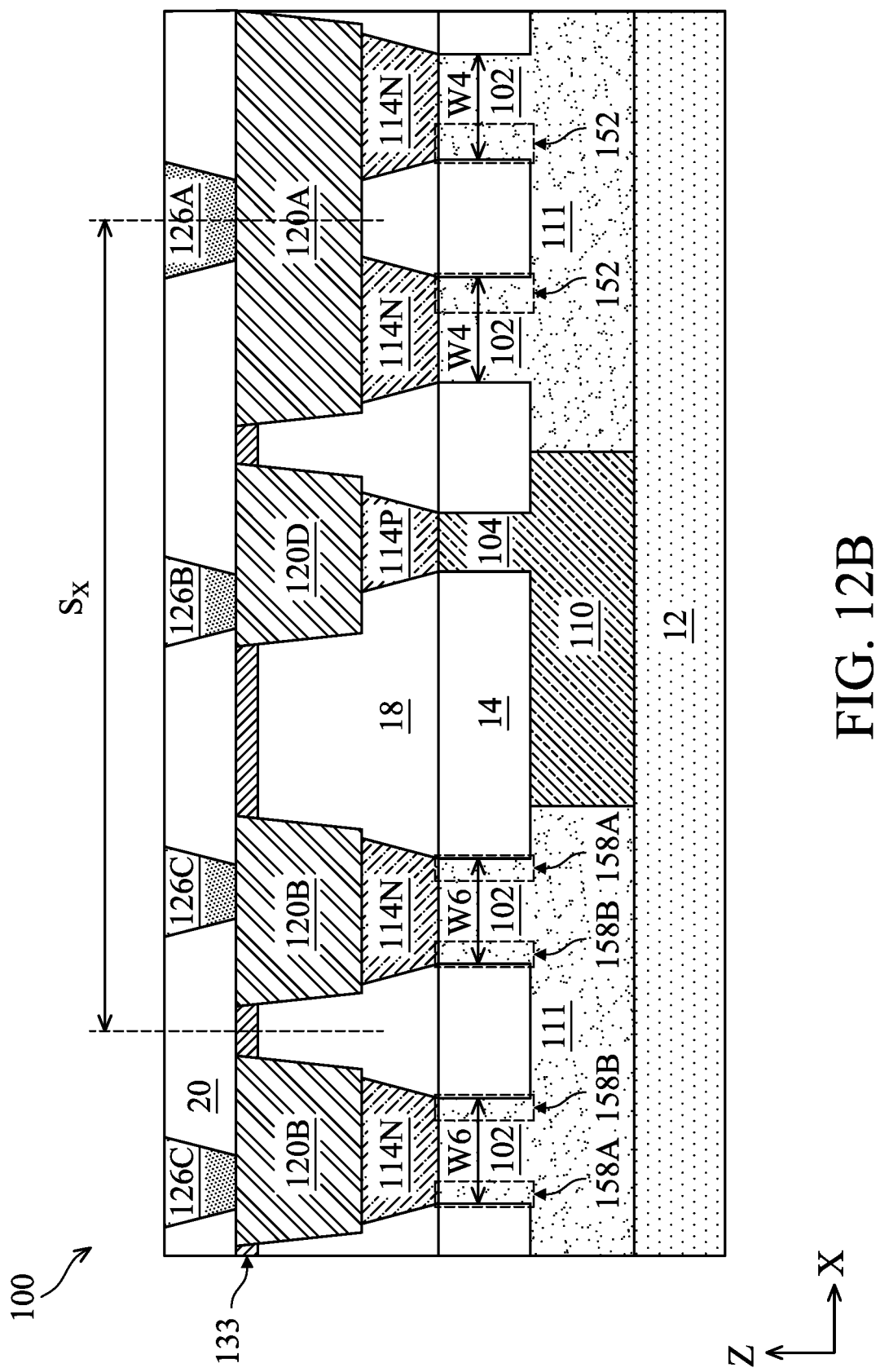
FIG. 12B is a cross-sectional view, in portion or entirety, of the IC structure taken along line LL' of FIG. 12A according to various aspects of the present disclosure.

Various embodiments of portions of the SRAM array 100 are discussed in detail below. FIGS. 2A, 2B, 8A, and 8B are schematic planar top views, in portion or in entirety, of embodiments of the SRAM array 100 that include multiple SRAM cells 101; FIGS. 4A, 5A, 6A, and 7A are each a schematic planar top view of one of the SRAM cells 101 (e.g., using the SRAM cell 101C as an example embodiment) depicted in FIGS. 2A and 2B; and FIGS. 9A, 10A, 11A, and 12A are each a schematic planar top view of one of the SRAM cells 101 (e.g., using the SRAM cell 101C as an example embodiment) as depicted in FIGS. 8A and 8B. FIGS. 4B-4F are schematic cross-sectional views, in portion or in entirety, of FIG. 4A taken along lines AA', BB', CC', DD', and EE', respectively. FIG. 5B is a schematic cross-sectional view, in portion or in entirety, of FIG. 5A taken along line FF'; FIG. 6B is a schematic cross-sectional view, in portion or in entirety, of FIG. 6A taken along line GG'; FIG. 7B is a schematic cross-sectional view, in portion or in entirety, of FIG. 6A taken along line HH'; FIG. 9B is a schematic cross-sectional view, in portion or in entirety, of FIG. 9A taken along line II'; FIG. 10B is a schematic cross-sectional view, in portion or in entirety, of FIG. 10A taken along line JJ'; FIG. 11B is a schematic cross-sectional view, in portion or in entirety, of FIG. 11A taken along line KK'; and FIG. 12B is a schematic cross-sectional view, in portion or in entirety, of FIG. 12A taken along line LL'. Additional features can be added to the SRAM array 100 and some of the features described below can be replaced, modified, or eliminated in other embodiments of the SRAM cell 100.

In the present embodiments, referring to FIGS. 2A, 2B, and 4A-4F, the SRAM array 100 (as a portion of the IC structure 10) is formed over a substrate (or a wafer) 12 having a plurality of p-wells (p-type doped regions) 111 and n-wells (n-type doped regions) 110 formed therein (and/or thereover) according to various design requirements of the SRAM array 100. In the depicted embodiments, the portion of the substrate 12 within each SRAM cell 101 (e.g., the SRAM cell 101C as depicted in FIGS. 4A-7B) includes an n-well 110 disposed between two p-wells 111. The n-well 110 is configured to provide at least one PFET, such as a pull-up transistor, and each p-well 111 is configured to provide at least one NFET, such as a pull-down transistor or a pass-gate transistor. In some embodiments, the substrate 12 includes additional doped regions configured to provide one or more transistors according to design requirements of the SRAM array 100. The SRAM array 100 further includes isolation structures 14 disposed over the substrate 12 to electrically separate various active regions formed over the substrate 12. In the present embodiments, the isolation structures 14 include shallow trench isolation (STI) features. In the present embodiments, each SRAM cell 101 includes two p-type fins 106 each disposed in a p-type well 111 and two n-type fins 108 disposed in an n-type well 110 interposing between the two p-type wells 111.

In the present embodiments, each p-type fin 106 includes a stack of semiconductor layers 105 disposed over a base fin 102; similarly, and each n-type fin 108 includes a stack of semiconductor layers 107 disposed over a base fin 104. In the depicted embodiments, the semiconductor layers 105 and 107 are generally oriented lengthwise along the Y-axis and stacked vertically along the Z-axis. Furthermore, each stack of the semiconductor layers 105 interposes n-type source/drain (S/D) features 114N formed over the base fin 102, and each stack of the semiconductor layers 107 interposes p-type S/D features 114P formed over the base fin 104.

Each of the channel layers 105 and 107 may include Si, Ge, SiC, SiGe, GeSn, SiGeSn, SiGeCSn, other suitable semiconductor materials, or combinations thereof. In the present embodiments, each of the semiconductor layers 105 and 107 includes Si in the form of a nanosheet, a nanowire (e.g., a nanowire having a hexagonal cross-section), a nanorod (e.g., a nanorod having a square or round cross-section), or other suitable configurations. In some embodiments, the p-type fin 106 and the n-type fin 108 each include two to ten channel layers 105 and 107, respectively. For example, the p-type fin 106 and the n-type fin 108 may each include three channel layers 105 and three channel layers 107, respectively. Of course, the present disclosure is not limited to such configurations and the number of semiconductor layers may be tuned according to design requirements for the IC structure 10.

Figure 2A:
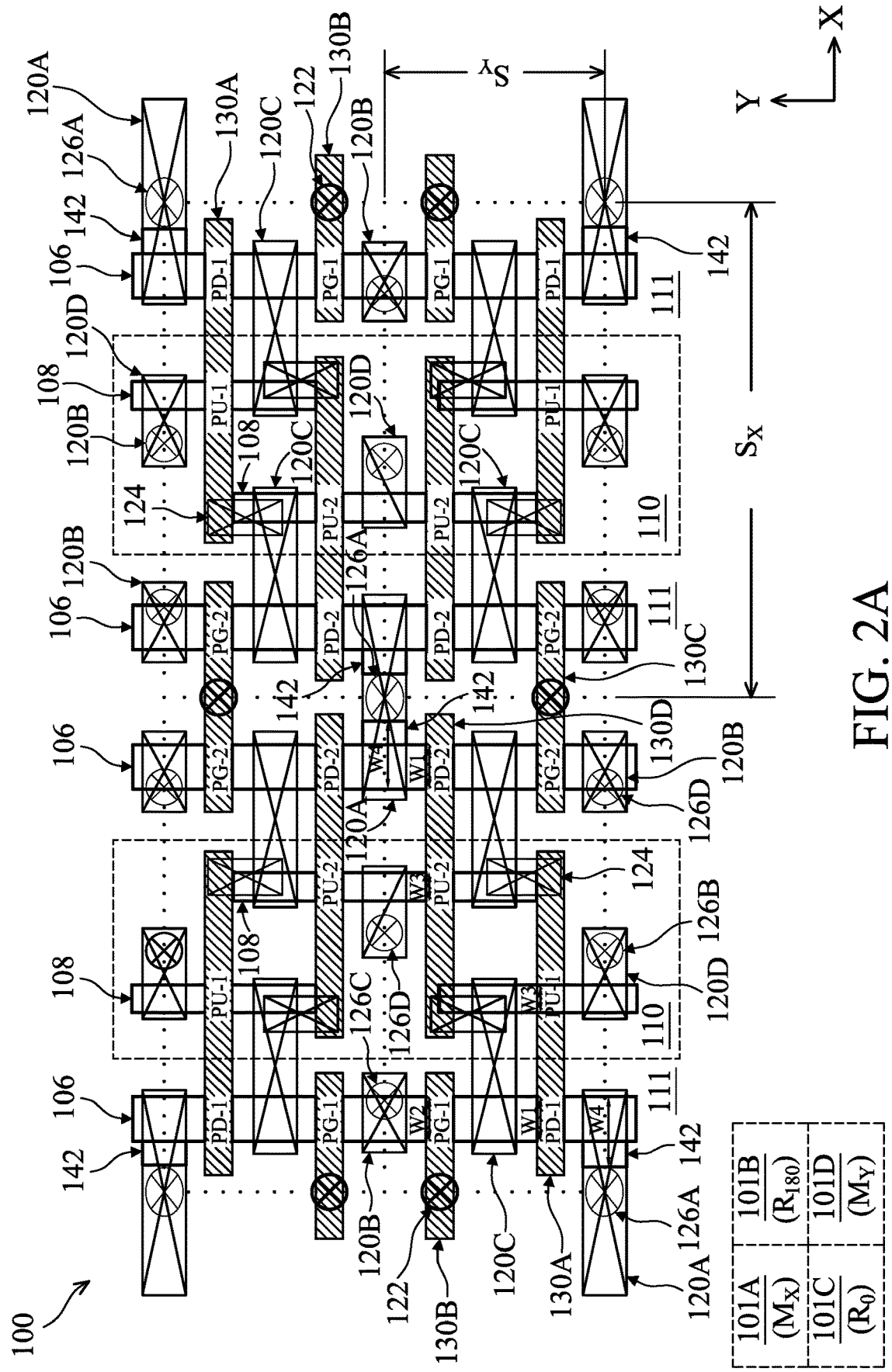
FIGS. 2A, 2B, 4A, 5A, 6A, 7A, 8A, 8B, 9A, 10A, 11A, and 12A are diagrammatic plan views of an IC structure including the SRAM cells of FIGS. 1B and/or 1C, in portion or entirety, according to various aspects of the present disclosure.
Figure 2B:
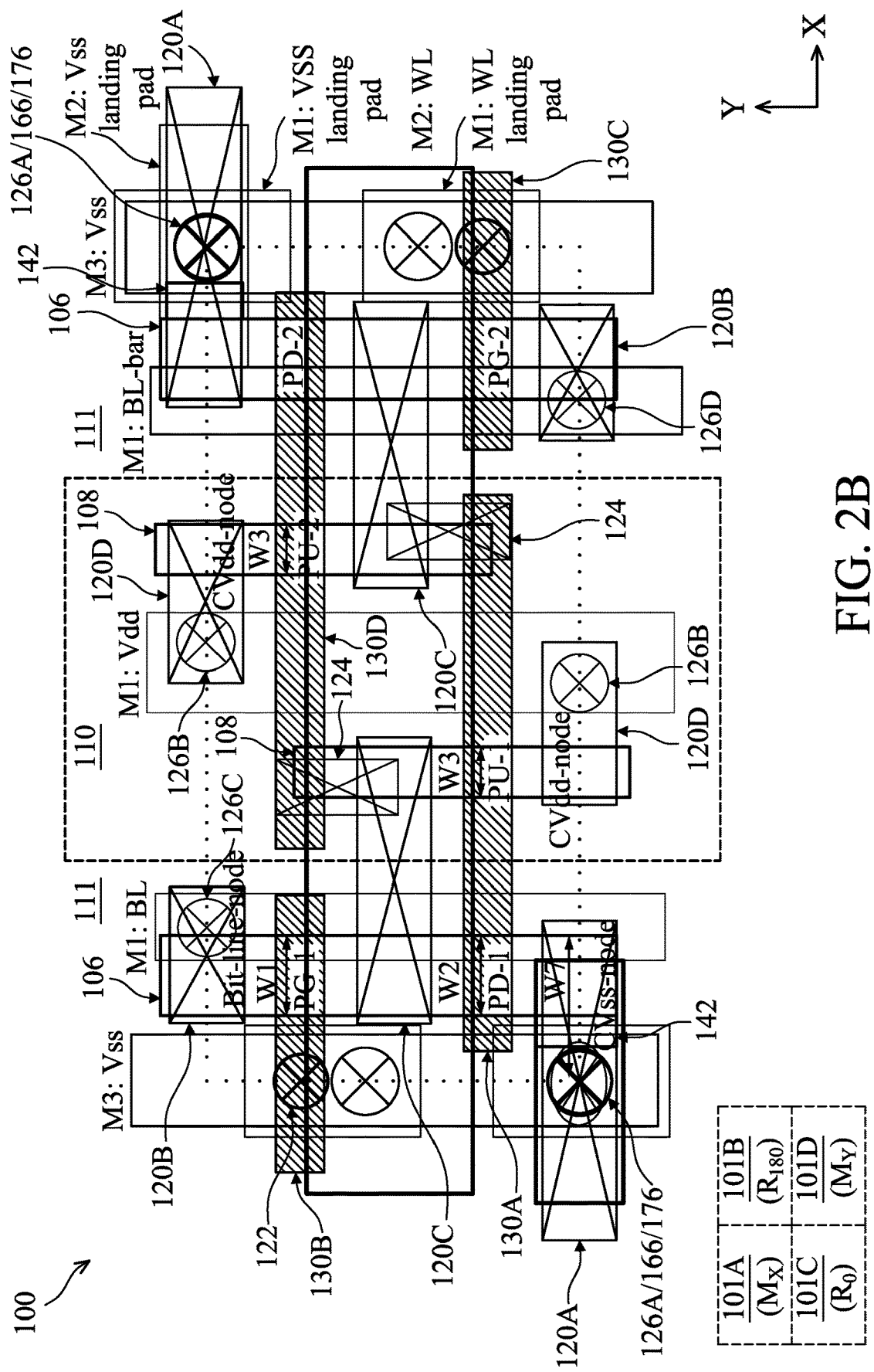

Still referring to FIGS. 2A and 2B, each SRAM cell 101 further includes gate stacks, such as gate stacks 130A, 130B, 130C, and 130D, oriented lengthwise along the X-axis and disposed over the p-type fins 106 and/or the n-type fins 108 to form various transistors. Each gate stack 130A-130D traverses a channel region of a p-type fin 106 and/or an n-type fin 108. In the present embodiments, the semiconductor layers 105 are suspended in (or wrapped around by) the gate stacks 130A-130D (e.g., the gate stack 130B and the gate stack 130D as depicted in FIG. 4C) to form GAA NFETs, and the semiconductor layers 107 are suspended in (or wrapped around by) one of the gate stacks 130A-130D (e.g., the gate stack 130D depicted in FIG. 4C) to form GAA PFETs. In other words, each stack of the semiconductor layers 105 engages with a portion of the gate stack 130A-130D to form a channel region of a GAA NFET, and each stack of the semiconductor layers 107 engages with a portion of the gate stack 130A-130D to form a channel region of a GAA PFET. As such, the semiconductor layers 105 are hereafter referred to as channel layers 105, and the semiconductor layers 107 are hereafter referred to as channel layers 107 for purposes of clarity.

Figure 4C:
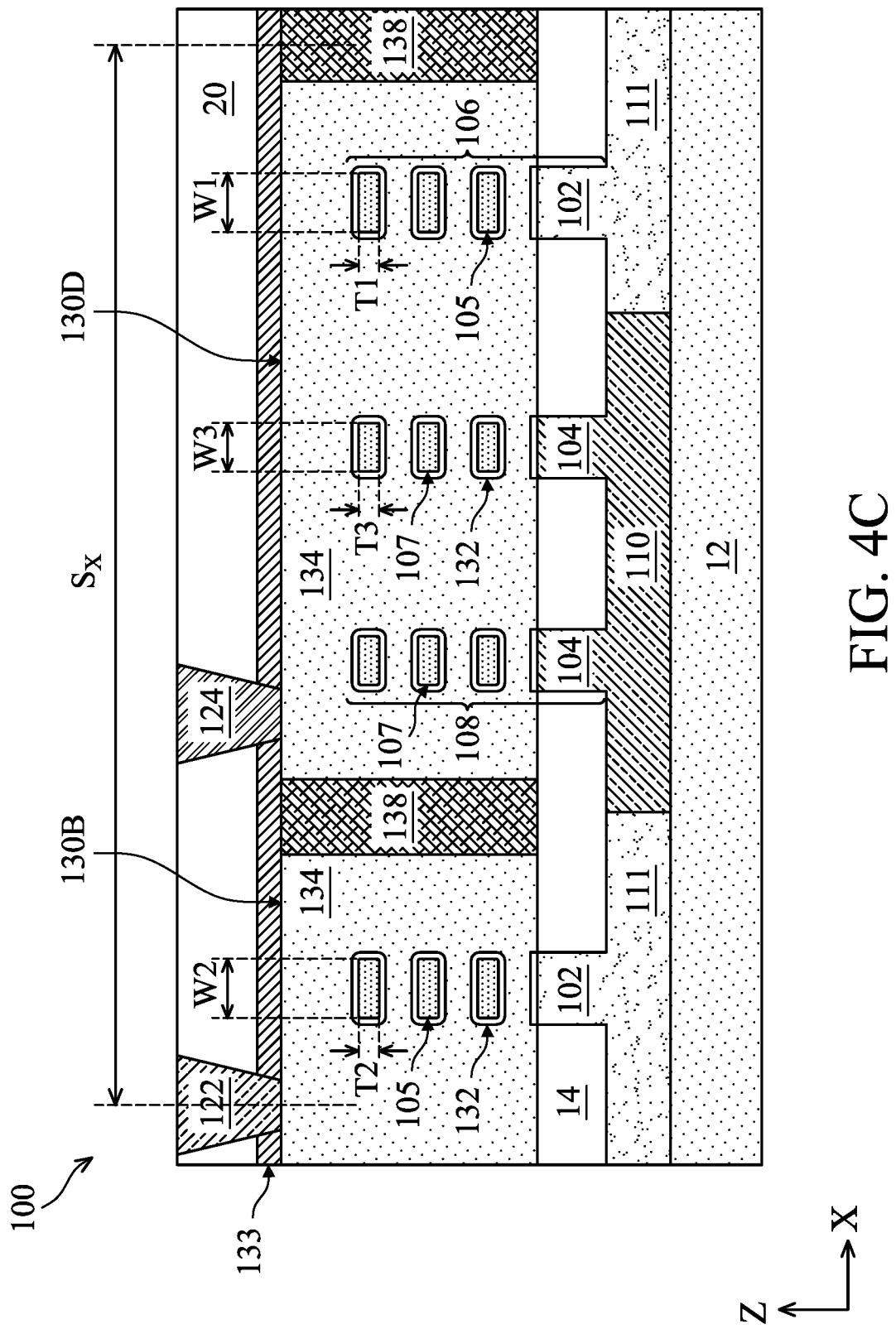
Figure 4D:
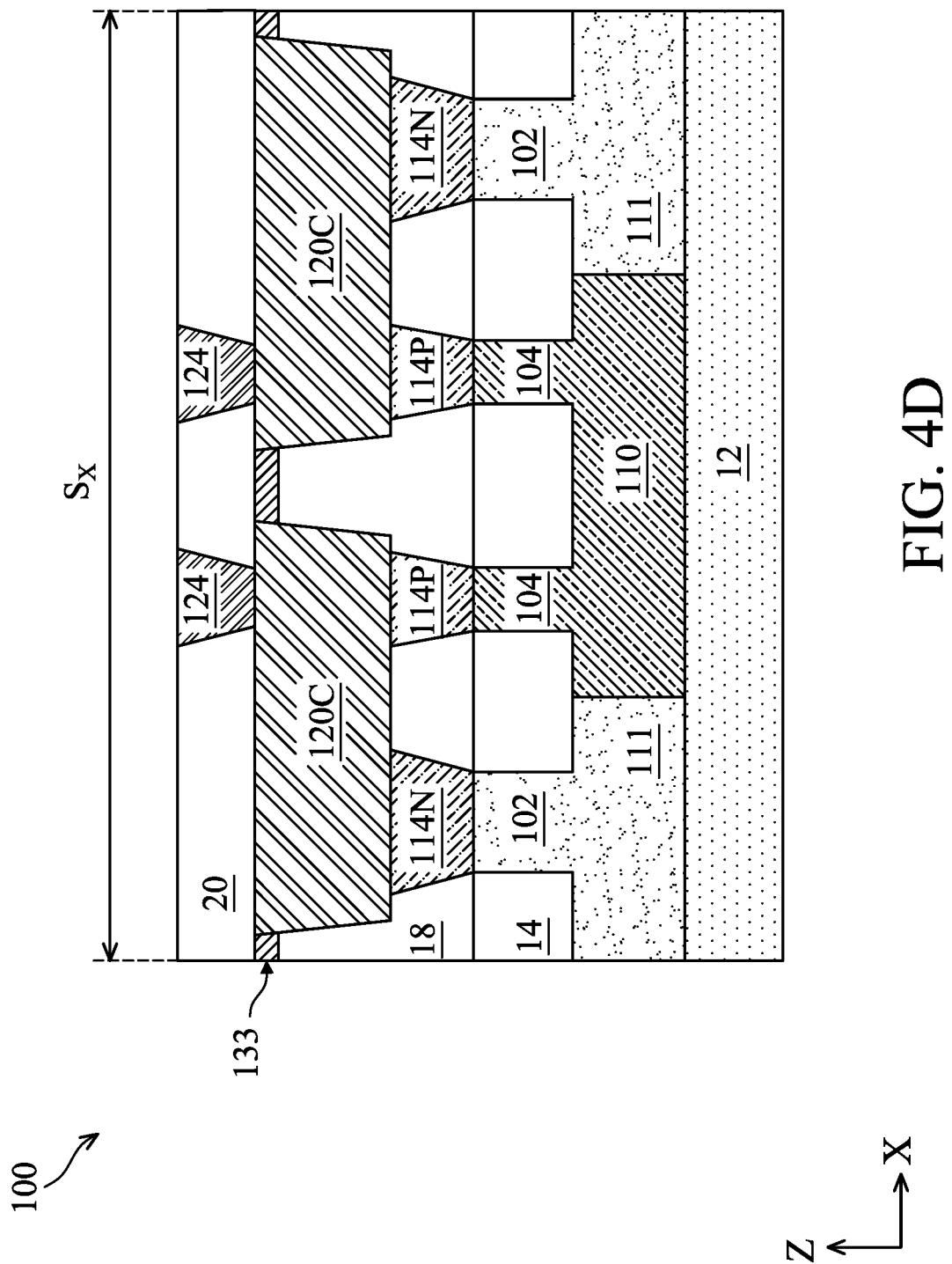
Figure 4F:
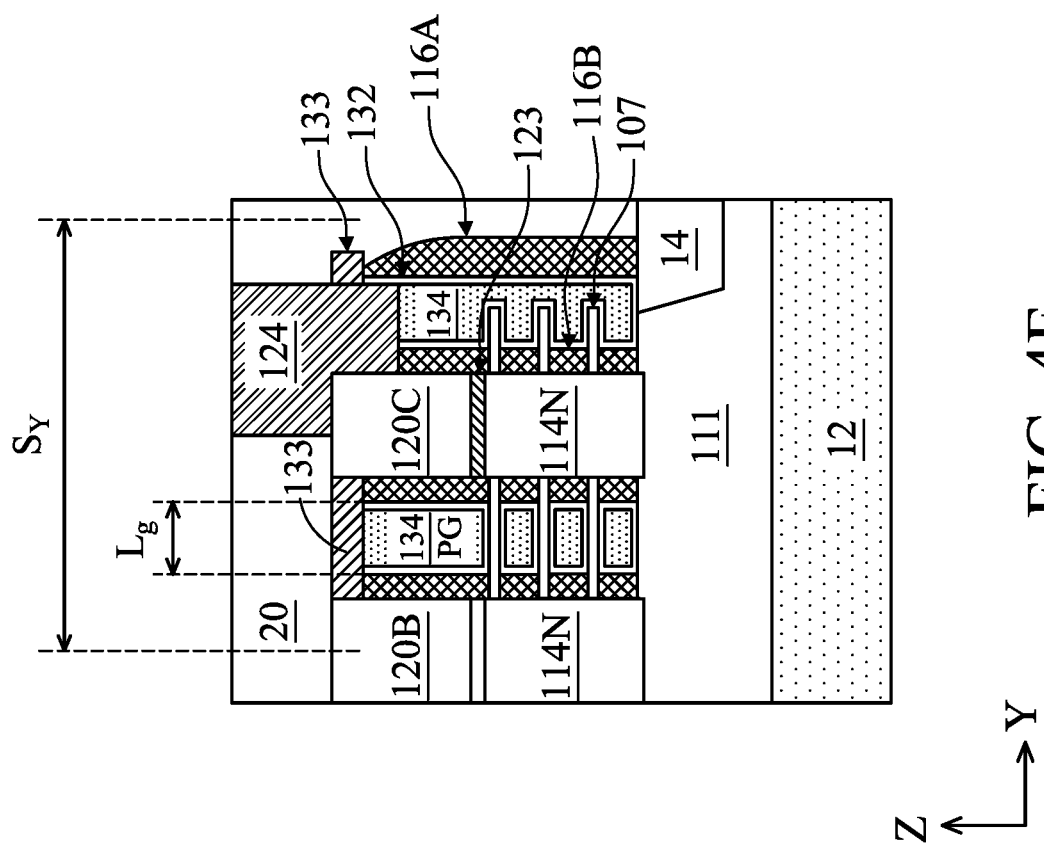
Figure 4E:
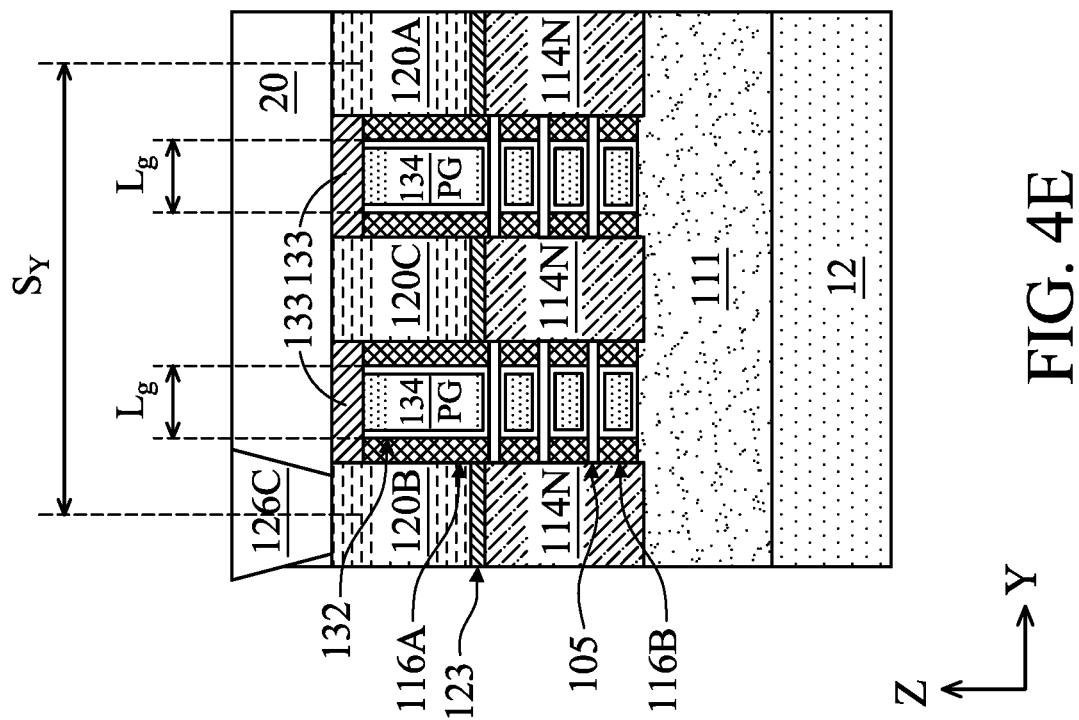

In the present embodiments, referring to FIGS. 4C, 4E, and 4F, the gate stacks 130A-130D are high-k metal gate structures and thus each include at least a high-k gate dielectric layer 132 wrapping around each channel layer 105 and 107 and a metal gate electrode 134 disposed over the high-k gate dielectric layer 132. Though not depicted, the metal gate electrode 134 includes a bulk conductive layer disposed over at least one work function metal layer. In some examples, adjacent gate stacks along the X-axis may be separated by gate isolation features 138. Each gate stack 130A-130D may further include top spacers 116A and inner spacers 116B disposed on its sidewalls, where the top spacers 116A are disposed over the channel layers 105 and 107 and the inner spacers 116B are disposed in the space between two vertically stacked channel layers 105 or two vertically stacked channel layers 107.

In the depicted embodiments, referring to FIG. 4A as an example, portions of the gate stack 130A engage with the first p-type fin 106 and a first n-type fin 108 to form a first pull-down transistor (PD-1) and a first pull-up transistor (PU-1), respectively; a portion of the gate stack 130B engages with a first p-type fin 106 to form a first pass-gate transistor (PG-1); a portion of the gate stack 130C engages with the second p-type fin 106 to form a second pass-gate transistor (PG-2); and portions of the gate stack 130D engage with a second p-type fin 106 and a second n-type fin 108 to form a second pull-down transistor (PD-2) and a second pull-up transistor (PU-2), respectively. In some embodiments, the PU-1 and the PU-2 are configured as p-type transistors, while the PD-1, the PD-2, the PG-1, and the PG-2 are configured as n-type transistors.

In the present embodiments, referring to FIGS. 2A, 2B, 3A, and 4A, a gate terminal of the PU-1 interposes a source terminal (hereafter interchangeably referred to as a source node), which is electrically coupled to a power supply voltage ($CV_{DD}$), and a first common drain (CD-1), and a gate terminal of the PD-1 interposes a source terminal, which is electrically coupled to a power supply voltage ($CV_{SS}$), and CD-1. A gate terminal of the PU-2 interposes a source terminal, which is electrically coupled to $CV_{DD}$, and a second common drain (CD-2), and a gate terminal of the PD-2 interposes a source terminal, which is electrically coupled to $CV_{SS}$, and CD-2. Accordingly, the source terminals of the PD-1 and PD-2 are referred to as $CV_{SS}$ nodes, and the source terminals of the PU-1 and PU-2 are referred to as $CV_{DD}$ nodes. In some embodiments, CD-1 is a storage node (SN) that stores data in true form, and CD-2 is a storage node (SNB) that stores data in complementary form. A gate terminal of the PG-1 interposes a source terminal, which is electrically coupled to a bit line (BL), and a drain terminal electrically coupled to CD-1. A gate terminal of the PG-2 interposes a source terminal, which is electrically coupled to a complementary bit line (BLB), and a drain terminal electrically coupled to CD-1. Accordingly, the source terminals of the PG-1 and PG-2 are referred to as BL node and BLB node, respectively. Furthermore, the gate terminals of PG-1 and PG-2 are electrically coupled to a word line (WL), which is generally oriented parallel to the lengthwise direction of the gate stacks 130A-130D.

Figure 3A:
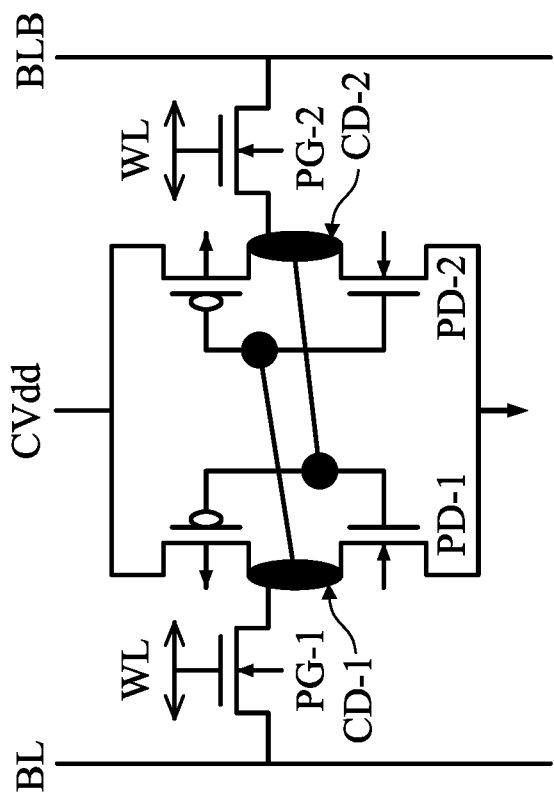
FIGS. 3A and 3B are schematic illustrations of an IC structure including the SRAM cells of FIGS. 1B and/or 1C, in portion or entirety, according to various aspects of the present disclosure.
Figure 3B:
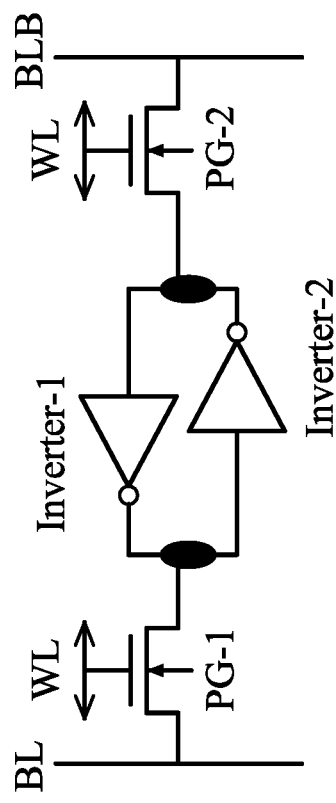

In some embodiments, referring to FIG. 3B, each SRAM cell 101 includes two cross-coupled inverters: a first inverter comprising PU-1 and PD-1, and a second inverter comprising PU-2 and PD-2. In some embodiments, PG-1 and PG-2 provide access to SN and SNB, respectively, during read operations and/or write operations. For example, PG-1 couples SN to BL and the PG-2 couples SNB to BLB in response to voltage applied by WL to the gate terminals of PG-1 and PG-2, respectively.

Referring to FIG. 2B, BL, BLB, $CV_{DD}$, $CV_{SS}$, WL, and their respective landing pads are schematically illustrated as multiple horizontal interconnect structures (hereafter referred to as metal layers) as portions of a multi-layer interconnect (MLI) structure disposed over the SRAM array 100 as discussed above. For example, BL, BLB, $CV_{DD}$, and landing pads for $CV_{SS}$ and WL are formed in the first metal layer M1, WL and landing pad for $CV_{SS}$ are formed in the second metal layer M2, and $CV_{SS}$ is formed in the third metal layer M3. Additionally, the SRAM array 100 may further include vertical interconnect structures (also referred to as vias) to electrically connect various GAA FETs with a suitable horizontal interconnect structure and/or to electrically connect two horizontal interconnect structures together. For example, vias 126A-126D are each configured to interconnect one of the device-level S/D contacts (e.g., S/D contacts 120A-120D) with a portion of the first metal layer M1, vias 166 are configured to interconnect the first metal layer M1 to the second metal layer M2, and vias 167 are configured to interconnect the second metal layer M2 to the third metal layer M3. As will be discussed in detail below, the MLI may further include other components, including gate contacts 122 and butted contacts (BCT) 124.

Now referring collectively to FIGS. 4A, 4B, and 4D-4F, the GAA NFETs (e.g., PD-1, PD-2, PG-1, and PG-2) each include n-type S/D features 114N grown over the S/D regions of the p-type fin 106, and the GAA PFETs (e.g., PU-1 and PU-2) each include p-type S/D features 114P grown over the S/D regions of the n-type fin 108. The n-type S/D features 114N and the p-type S/D features 114P each include one or more epitaxially grown semiconductor material doped with a dopant of a suitable conductivity type, i.e., n-type or p-type, respectively. In such embodiments, the n-type S/D features 114N and the p-type S/D features 114P are grown from a portion of the p-type fin 106 and n-type fin 108, respectively. In some examples, one or more of the n-type S/D features 114N and the p-type S/D features 114P may be merged, such that they span over more than one fins.

In the present embodiments, each SRAM cell 101 includes a plurality of S/D contacts 120A, 120B, 120C, and 120D oriented lengthwise along the X-axis. In the depicted embodiments, each S/D contact 120A lands on two n-type S/D features 114N, each S/D contact 120B lands on one n-type S/D feature 114N, each S/D contact 120C lands on one n-type S/D feature 114N and a neighboring p-type S/D feature 114P, and each S/D contact 120D lands on one p-type S/D feature 114P. In the present embodiments, as depicted in FIGS. 4B and 4D, each of the S/D contacts 120A-120D physically contacts a top surface of one or more S/D features over which it is formed. As such, different S/D contacts 120A-120D may vary in length along the X-axis depending upon the number of S/D feature(s) and/or the separation distance between two adjacent S/D features over which they are formed. For example, the S/D contacts 120A and 120C may each be longer than the S/D contacts 120B and 120C. The S/D contacts 120A-120D may alternatively be referred to as device-level contacts to be differentiated from other contact features (e.g., vias) subsequently formed as portions of the MLI structure.

In the present embodiments, referring to FIGS. 2A, 2B, 4A, 4B, and 4E, the vias 126A, 126B, 126C, and 126D, as portions of the MLI discussed above, are configured to electrically connect various GAA FETs with the first metal layer M1 as depicted in FIG. 2B. For example, each via 126A is configured to interconnect the S/D contact 120A with subsequently-formed metal layers at the $CV_{SS}$ node, each via 126B is configured to interconnect the S/D contact 120D with subsequently-formed metal layers at the $CV_{DD}$ node, each via 126C is configured to interconnect the S/D contact 120B with subsequently-formed metal layers at the BL node, and each via 126D is configured to interconnect the S/D contact 120B with subsequently-formed metal layers at the BLB node. In some embodiments, as depicted in a plan-view of the MLI structure in FIGS. 2 and 4A, an area of the via 126A is configured to be greater than an area of each of the vias 126B-126D in order to reduce resistance at the corresponding source nodes of the PD transistors (PD-1 and PD-2). In some examples, a ratio of the area of the via 126A to the area of each of the vias 126B-126D may be about 1.2 to about 4. A ratio of less than about 1.2 may not produce significant reduction in resistance and a ratio of greater than about 4 may pose concerns in processing margin of the patterning and etching processes to form the vias 126A-126D.

Referring to FIGS. 4B-4F, the SRAM array 100 may further include an interlayer dielectric (ILD) layer 18 in which the S/D contacts 120A-120D are disposed, an etch-stop layer (ESL) 133 disposed over the ILD layer 18, and an ILD layer 20 disposed over the ESL 133. In the depicted embodiments, portions of the MLI structure, including a gate contact 122 configured to electrically couple to the gate stack 130A-130D and a butted contact (BCT) 124 configured to connect a device-level S/D contact (e.g., the S/D contact 120C) disposed over the drain terminal of the PU-1 or PU-2 with an adjacent gate stack (e.g., the gate stack 130A or 130D), are disposed in the ILD layer 20.

As semiconductor fabrication continues to advance toward smaller technology nodes, challenges arise with respect to maintaining device performance at reduced lengths scales. While multi-gate FETs, such as GAA FETs (also referred to as nanosheet, or NS, FETs), have generally improved the ability to scale down dimensions of SRAM cells by providing more channel widths (in the form of vertically stacked channel layers) without enlarging device footprint or impacting the scaling of the channel length, they have not been entirely satisfactory in all aspects. For example, reduction in spacings between gate stacks (i.e., the gate pitch) has led to reduced landing area for S/D contacts, especially at $CV_{SS}$ nodes, causing potential increase in contact resistance thereof. Generally, improvements in the performance of an SRAM cell, including its processing speed and stability (e.g., manifested as static noise margin, or SNM), may depend upon the parasitic resistance of PD transistors source nodes, which should be reduced as much as possible. Specifically, because the processing speed is correlated with the magnitude of cell current and the cell current is controlled by cascaded PG and PD transistors, increasing the processing speed may be accomplished by reducing resistance of the PD transistors' source nodes. Furthermore, because the SNM is generally proportional to the ratio of Ion PD to Ion PG, the cell's stability may also benefit from reduced resistance (i.e., increased cell current) at the PD transistors' source nodes.

The present disclosure provides GAA FET structures having improved contact landing area as well as enlarged via sizes (planar area), of the SRAM cells in an effort to reduce resistance of at least the $CV_{SS}$ nodes without enlarging the overall sizes of the cells or sacrificing the density thereof. In the present embodiments, each SRAM cell includes at least a GAA NFET (e.g., a PD transistor) whose source node (e.g., corresponding to the $CV_{SS}$ node) is formed from a portion of a p-type fin having an enlarged width compared to its channel region.

In the present embodiments, referring back to FIG. 4A as an example, the p-type fins 106 and the n-type fins 108 may each be described by a set of widths measured along the lengthwise direction of the gate stacks 130A-130D, i.e., along the X-axis. With respect to the stacks of the channel layers 105 and 107, the term "width" refers to a lateral distance of each channel layer measured along the X-axis and averaged along their stacking direction, i.e., along the Z-axis. As discussed above, each p-type fin 106 includes stacks of the channel layers 105 engaged with the gate stacks 130A-130D and interposed between portions of the p-type fin 106 over which the n-type S/D features 114N are formed, and each n-type fin 108 includes stacks of the channel layers 107 engaged with the gate stacks 130A-130D and interposed between portions of the n-type fin 108 over which the p-type S/D features 114P are formed. For purposes of the following discussion, each stack of the channel layers 105 configured as the channel region of the PD-1 or PD-2 is defined by a width W1; each stack of the channel layers 105 configured as the channel region of the PG-1 or PG-2 is defined by a width W2; each stack of the channel layer 107 configured as the channel region of the PU-1 or PU-2 is defined by a width W3; each portion of the p-type fin 106 configured to provide the source terminal of the PD-1 or PD-2 (that is further coupled to the $CV_{SS}$ node) is defined by a width W4; each portion of the n-type fin 108 configured to provide the source terminal of the PU-1 or PU-2 (that is further coupled to the $CV_{DD}$ node) is defined by a width W5; and each portion of the p-type fin 106 configured to provide the source terminal of the PG-1 or PG-2 (that is further coupled to the BL node or the BLB node, respectively), is defined by a width W6.

In the present embodiments, collectively referring to FIGS. 2A-11B, the width of the portion of the p-type fin 106 configured to provide the source terminals of the PD-1 and PD-2, i.e., further connected to the $CV_{SS}$ node, is greater than the width of the stack of the channel layers 105 configured as the channel region of the same devices, i.e., the width W4 is greater than the width W1. In other words, the width of each p-type fin 106 configured to provide the PD-1 or PD-2 increases from a channel region to a source region along its lengthwise direction, i.e., along the Y-axis. Furthermore, the present embodiments provide that, for each of the PD-1 and PD-2, the portion of the p-type fin 106 corresponding to the $CV_{SS}$ node extends laterally beyond the stack of the channel layers 105 toward a nearest adjacent SRAM cell 101. In other words, the difference between the widths W4 and W1 defines a protruding portion 142 of the p-type fin 106 that extends laterally away from an adjacent n-type fin 108, which is configured to provide the PU-1 or PU-2 in the same SRAM cell 101. Referring to FIGS. 2A and 2B and using the SRAM cell 101C as an example, the protruding portion 142 extends laterally toward the adjacent SRAM cell 101D. As will be discussed in detail below, enlarging the width W4 with respect to the width W1 increases a landing area for a subsequently-formed source contact (e.g., the S/D contact 120A) without enlarging the overall footprint of the p-type fin 106 or the scaling of the SRAM cell 101.

In some embodiments, collectively referring to FIGS. 2A, 2B, 4A, and 4B, the protruding portion 142, while extending laterally toward an adjacent SRAM cell 101, does not cross over a vertical cell boundary disposed between the two SRAM cells 101, e.g., between the SRAM cells 101C and 101D in the depicted embodiments. In other words, the protruding portion 142 of one SRAM cell 101 is separated from the protruding portion 142 of an adjacent SRAM cell 101, where the layouts of the two SRAM cells 101 are mirror images about the vertical cell boundary disposed therebetween. In the present embodiments, the protruding portion 142 allows the n-type S/D features 114N at the source terminal of the PD-1 and PD-2 to be formed to a larger size, thereby increasing the contact area and decreasing the contact resistance between the n-type S/D features 114N and the subsequently-formed S/D contacts, e.g., the S/D contact 120A depicted in FIG. 4B, which is further coupled to a $CV_{SS}$ node. For example, referring specifically to FIG. 4B, because the width W4 is larger than width W1 by the width of the protruding portion 142, both the size of the n-type S/D feature 114N formed thereover and the landing area of the subsequently-formed S/D contact 120A are both enlarged accordingly. Notably, in the present embodiments, the n-type S/D features 114N of the two adjacent SRAM cells 101 are separated, as are the portions of the p-type fins 106 over which they are formed, while the S/D contact 120A lands on the separated n-type S/D features 114N.

In some embodiments, a ratio of the width W4 to the width W1 is determined based on the spacing between two nearest p-type fins 106 disposed in neighboring SRAM cells 101. In some examples, the ratio of the width W4 to the width W1 may be at least about 1.5 and less than about 3. In other words, a ratio of the width of the protruding portion 142 to the width W1 is at least about 0.5 and less than about 2. While other ratios may also be applicable to the present embodiments, it is noted that a ratio of W4/W1 of less than about 1.5 may not provide sufficient enlargement in contact area for the subsequently formed S/D contacts for any enhancement in device performance to be realized. In some examples, W1 may be about 6 nm to about 50 nm and W4 may thus be about 12 nm to less than about 120 nm.

In some embodiments, referring to FIG. 4A, the width of each stack of the channel layers 105 configured as the channel regions of the PG-1 and PG-2 is less than or substantially the same as the width of the stack of the channel layers 105 configured as the channel regions of the PD-1 and PD-2, i.e., the width W2 is no greater than the width W1. As provided herein, the width W4 is widened relative to the width W1 to increase the effective contact area between its n-type S/D features and the subsequently-formed S/D contact. In some embodiments, enlarging the width W4 leads to unintentional enlargement of the width W1 (though to a lesser extent such that the width W1 remains less than the width W4) of the same PD transistor (e.g., the PD-1) with respect to portions of the same p-type fin 106 configured to provide a PG transistor (e.g., the PG-1). In some instances, as will be discussed in detail below, such enlargement may be attributed to a rounding effect of the lithographic patterning process during the formation of the p-type fin 106. Accordingly, the difference between the width W1 and the width W2, if greater than zero, may be about 2 nm to about 10 nm, where the specific value may be dependent upon operating parameters of the lithographic patterning process.

In some embodiments, still collectively referring to FIGS. 2A-11B, the width of each stack of the channel layers 107 configured as the channel regions of the PU-1 and PU-2 is less than the width of the stack of the channel layers 105 configured as the channel regions of the PD-1, PD-2, PG-1, and PG-2, i.e., the width W3 is less than the widths W1 and W2. In some embodiments, the widths W1 and W2 are each greater than the width W3 by at least about 10% of the width W3. In some examples, a ratio of the width W1 or the width W2 to the width W3 may be about 1.2 to about 6. The relatively narrower channel region of a GAA PFET (e.g., PU-1, PU-2, etc.) in the SRAM cell 101 provides at least the benefit of reducing cell size and increasing the cell's write margin (i.e., processing speed), where the ratio of about 1.2 accounts for a minimal difference between the width W1 (or the width W2) and the width W3 that is capable of producing a gain on the processing speed of the SRAM cell 101 as provided herein. While the present embodiments are not limited to such range of ratios, specific ratios of W1 to W2 may be determined based on factors such as a size of the SRAM cell 101 suitable for a desired IC application.

Referring specifically to FIG. 4C, each stack of the channel layers 105 and 107 may be further defined by a layer thickness measured along the stacking direction of the channel layers (i.e., the Z-axis). For example, each stack of the channel layers 105 configured to form the PD-2 (and PD-1; not depicted) is defined by a layer thickness T1, each stack of the channel layers 105 configured to form the PG-1 (and PG-2; not depicted) is defined by a layer thickness T2, and each stack of the channel layers 107 configured to form the PU-2 (and PU-1; not depicted) is defined by a layer thickness T3. In some embodiments, the layer thickness T1 is substantially the same as the layer thickness T2, and a ratio of the layer thickness T1 to the width W1 is about 1.2 to about 5. In some embodiments, the layer thickness T1 is substantially the same as the layer thicknesses T2 and T3, and a ratio of the layer thickness T3 to the width W3 is about 1 to about 2.5. Of course, other dimensions of the layer thickness may also be applicable to embodiments of the present disclosure. Furthermore, collectively referring to FIGS. 4E and 4F, each stack of the channel layers 105 and 107 may be further defined by a channel length $L_g$ measured along the lengthwise direction of their respective fin (i.e., the Y-axis). The present embodiments do not limit the value $L_g$, which may be about 6 nm to about 20 nm.

Figure 5A:
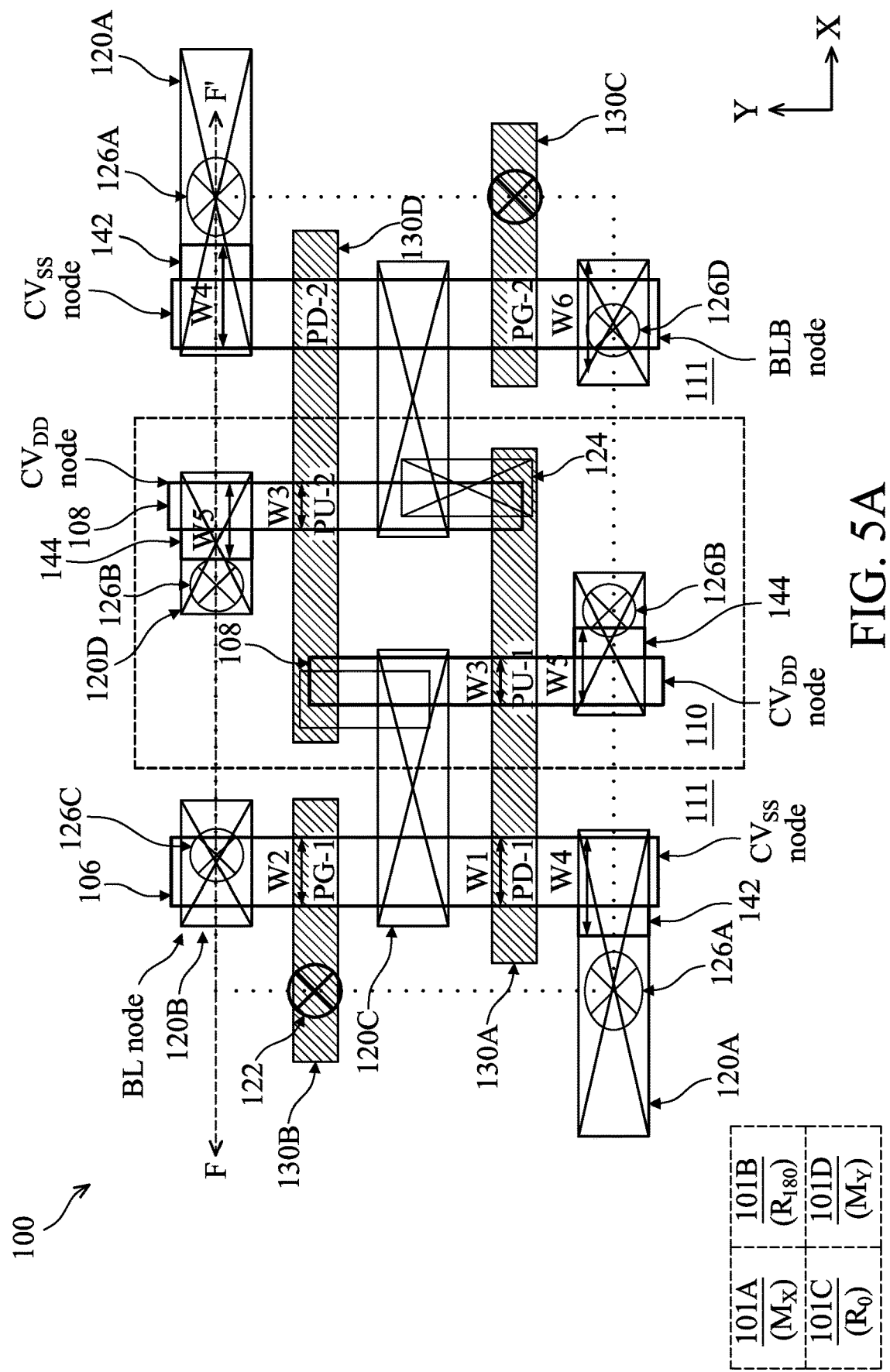
Figure 5B:
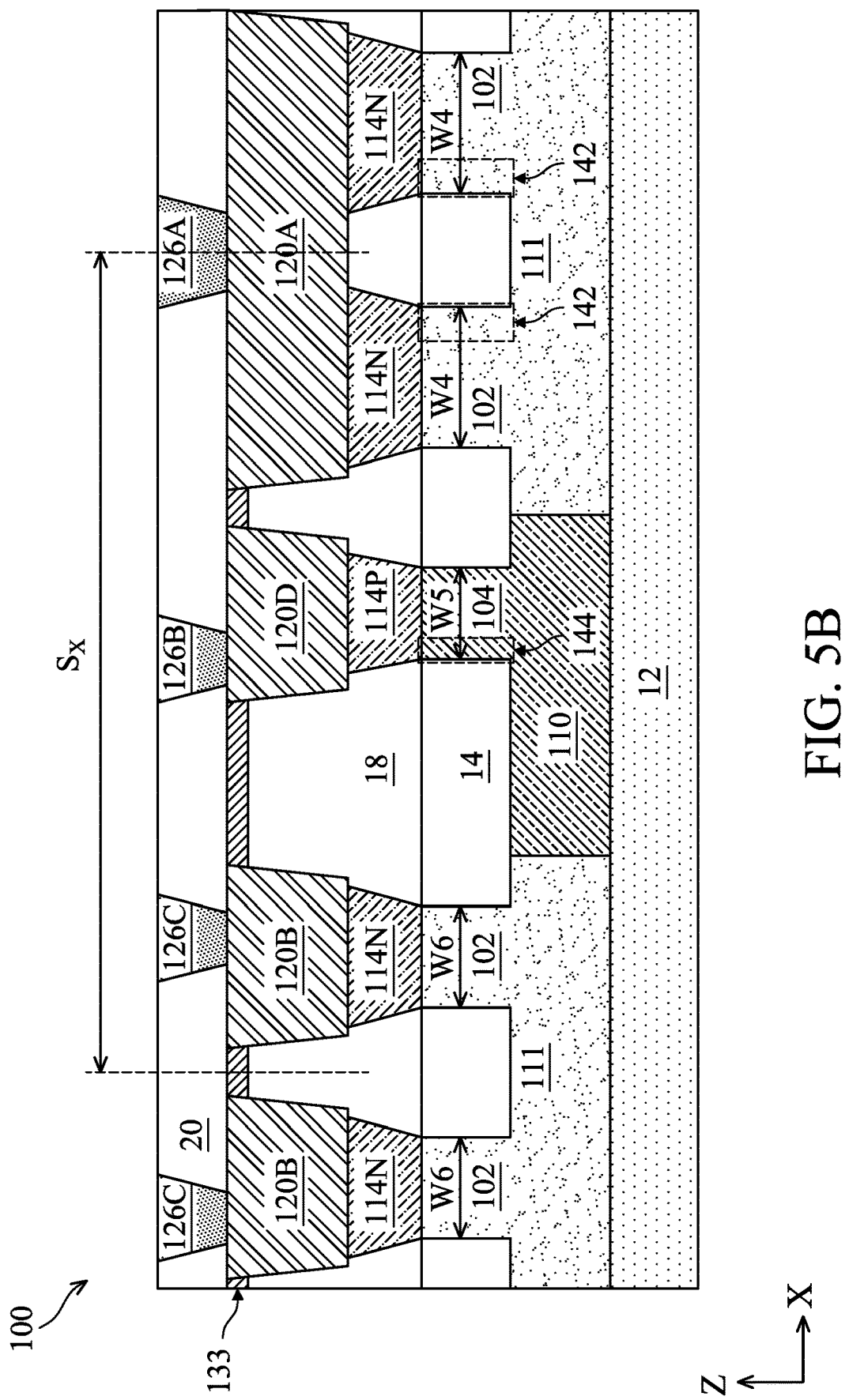
FIG. 5B is a cross-sectional view, in portion or entirety, of the IC structure taken along line FF' of FIG. 5A according to various aspects of the present disclosure.

Further to the embodiments depicted in FIGS. 2A, 2B, and 4A-4F, referring to FIGS. 5A and 5B now, the width of the portion of the n-type fin 108 configured to provide each source terminal of the PU-1 and PU-2 (further coupled to the $CV_{DD}$ node) is greater than the width of the stack of the channel layers 107 configured to form the same devices, i.e., the width W5 is greater than the width W3. In other words, the width of each n-type fin 108 configured to provide the PU-1 or PU-2 increases from a channel region to a source region along the Y-axis. Furthermore, the portion of the n-type fin 108 providing the source terminal extends laterally beyond the stack of the channel layers 107 toward an interior region of the SRAM cell 101 and away from a nearest adjacent p-type fin 106. In other words, the difference between the widths W5 and W3 defines a protruding portion 144 of the n-type fin 108 that extends, in its entirety, in a direction opposite to that of the protruding portion 142, which is configured to provide the source terminal of each of the PD-1 or the PD-2. Again, using the SRAM cell 101C as an example, the protruding portion 144 extends laterally away from the nearest adjacent SRAM cell 101D.

In the present embodiments, similar to the discussion regarding the protruding portion 142, the protruding portion 144 enlarges the area of the source terminal of the PU-1 and PU-2 (subsequently coupled to the $CV_{DD}$ node of the SRAM cell 101), thereby increasing its effective contact area with a subsequently-formed S/D contact, e.g., S/D contact 120D as depicted in FIG. 5B. In the present embodiments, the protruding portion 144 is configured to extend in a direction opposite to that of the protruding portion 142 to avoid inadvertent interference with the adjacent p-well 111. In some embodiments, the width W5 is less than the width W4. In some embodiments, the ratio of the width W5 to the width W3 is substantially the same as the ratio of the width W4 to the width W1. In some examples, the ratio of the width W5 to the width W3 may be at least about 1.5 and less than about 3. In other words, a ratio of the width of the protruding portion 144 to the width W3 may be at least about 0.5 and less than about 2. Of course, other ratios may also be applicable to the present embodiments.

Still further to the embodiments depicted in FIGS. 2A, 2B, and 4A-4F, collectively referring to FIGS. 6A-7B, the width W6 of the portion of the p-type fin 106 configured to provide each source terminal of the PG-1 and PG-2 (further coupled to the BL node or the BLB node) is greater than the width W1 of the stack of the channel layers 105 configured as the channel region of the same devices. In other words, the width of each p-type fin 106 configured to provide the PG-1 or PG-2 increases from a channel region to a source region along the Y-axis.

Figure 6A:
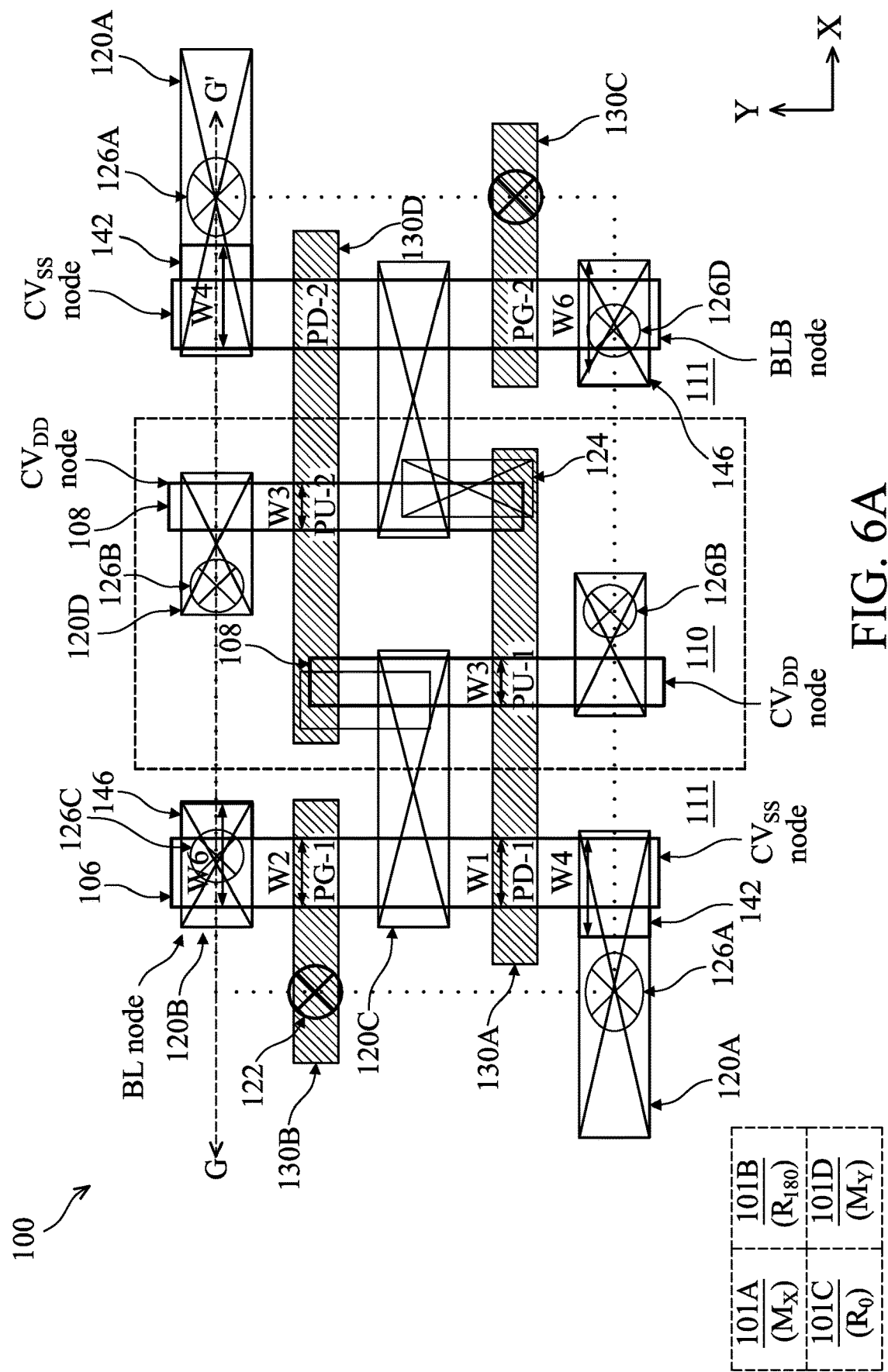
Figure 6B:
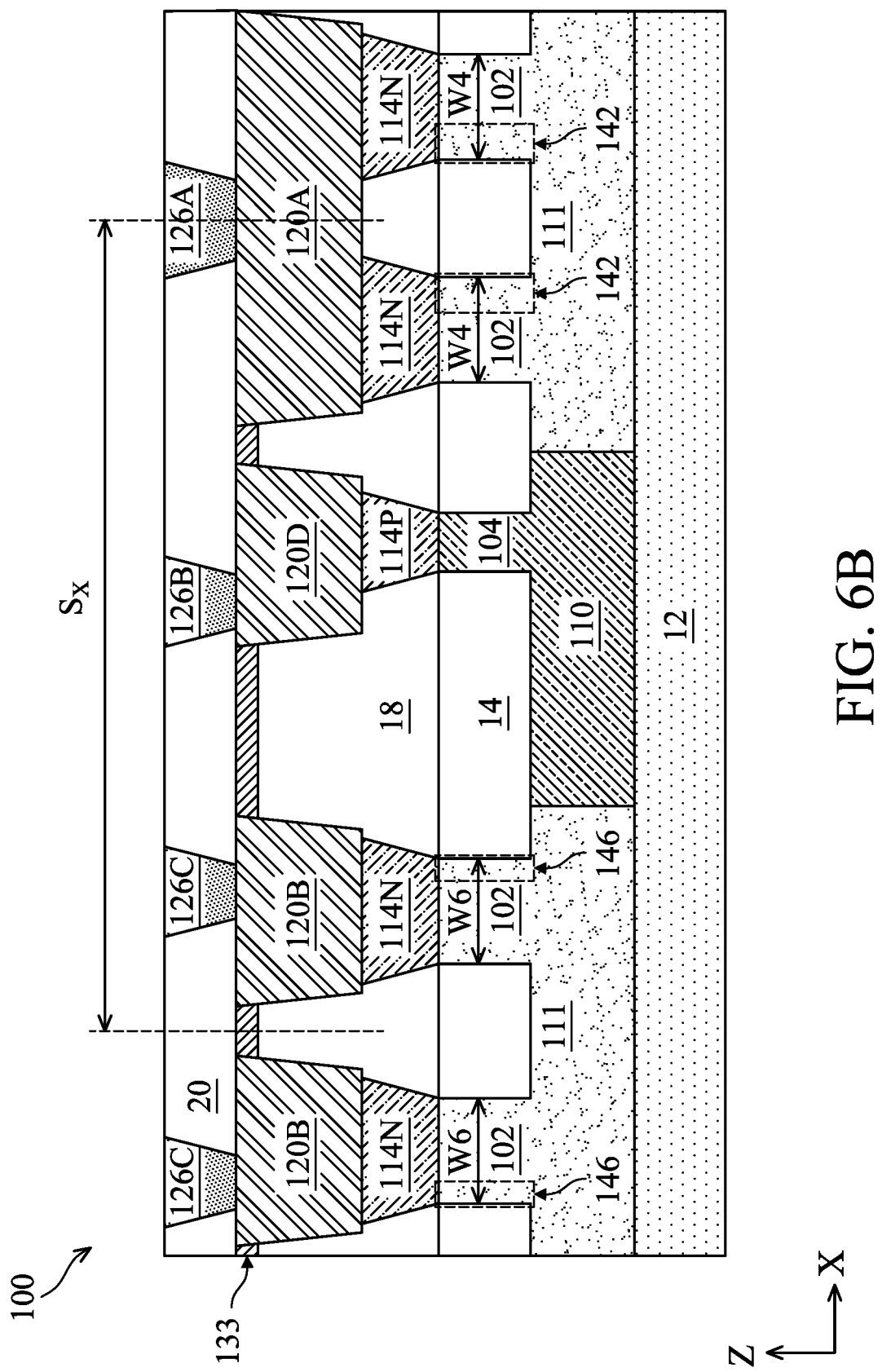
FIG. 6B is a cross-sectional view, in portion or entirety, of the IC structure taken along line GG' of FIG. 6A according to various aspects of the present disclosure.

In some embodiments, referring to FIGS. 6A and 6B, the portion of the p-type fin 106 providing each source terminal of the PG-1 and PG-2 extends unilaterally beyond the stack of the channel layers 105 toward the interior region of the SRAM cell 101 and away from a nearest adjacent SRAM cell 101. In other words, the difference between the widths W6 and W2 defines a protruding portion 146 of the p-type fin 106 that extends, in its entirety, in the same direction as that of the protruding portion 142. Alternatively, referring to FIGS. 7A and 7B, the portion of the p-type fin 106 corresponding to the BL node extends bilaterally beyond the stack of the channel layers 105. In other words, the difference between the widths W6 and W2 is distributed on both sides of the stack of the channel layers 105, defining protruding portions 148A and 148B.

In the present embodiments, the protruding portions 146 and the combination of the protruding portions 148A and 148B enlarge the area available to form the source terminal of the PG-1 and PG-2 (subsequently coupled to the BL node and the BLB node, respectively, of the SRAM cell 101), thereby increasing its effective contact area with a subsequently-formed S/D contact, e.g., S/D contact 120B as depicted in FIGS. 6B and 7B. Due to its proximity with the gate contact 122 disposed near or on the cell boundary and subsequently coupled to a landing pad of the WL, at least a portion of the p-type fins 106 configured to provide the source terminal for the PG-1 and PG-2 extends in a direction away from the nearest SRAM cell 101 to avoid inadvertent contact between the subsequently-formed S/D contact and the gate contact 122. Furthermore, in order to reduce potential interference with the adjacent n-well 110, the ratio of the width W6 to the width W2 is configured to be less than the ratio of the width W4 to the width W1. In some examples, the ratio of the width W6 to the width W2 may be at least about 1.3 and less than about 3. In some examples, a ratio of the width of the protruding portion 146 to the width W2 may be less than about 0.5. In some examples, a ratio of the sum of the widths of the protruding portions 148A and 148B to the width W2 may be less than about 0.5. Of course, other ratios may also be applicable to the present embodiments. In some examples, each SRAM cell 101 may include any one or more of the protruding portions 144, 146, and the combination of 148A and 148B in addition to the protruding portion 142.

Collectively referring to FIGS. 8A-9B, which depict embodiments similar to those of FIGS. 2A, 2B and 4A-4F discussed in detail above, width W7 of the portion of the p-type fin 106 configured to provide each source terminal of the PD-1 and PD-2 (further coupled to the $CV_{SS}$ node) is greater than the width W1 of the stack of the channel layers 105 configured as the channel regions of the same devices, and such portion of the p-type fin 106 extends laterally beyond the stack of the channel layers 105 toward the nearest adjacent SRAM cell 101. However, the difference between the widths W7 and W1 defines a protruding portion 152 of the p-type fin 106 that extends to the vertical cell boundary disposed between the two adjacent SRAM cells 101, e.g., between the SRAM cells 101C and 101D in the depicted embodiments. In other words, referring to FIG. 9B, the protruding portion 152 of one SRAM cell 101 merges with the protruding portion 152 of an adjacent SRAMC cell 101, where the layouts of the two SRAM cells 101 are mirror images about the vertical cell boundary disposed therebetween. Accordingly, in the present embodiments, a ratio of the width W7 to the width W1 is greater than the ratio of the width W4 to the width W1.

As discussed above, the protruding portions 152, similar to the protruding portions 142, enlarges the contact area between the n-type S/D features 114N and the S/D contacts (e.g., the S/D contact 120A in FIG. 9B) subsequently formed thereon, thereby reducing the contact resistance at the source nodes of the PD-1 and PD-2. In the present embodiments, still referring to FIG. 9B, the n-type S/D features 114N disposed over the p-type fins 106 in the neighboring SRAM cells 101 merge together, as do the portions of the p-type fins 106 over which they are formed do. In other words, the protruding portions 152 of two neighboring p-type fins 106 of adjacent SRAM cells 101 together provide one elongated n-type S/D feature 114N over which the S/D contact 120A is subsequently formed.

In some embodiments, a specific value of the ratio of the width W7 to the width W1 is determined based on the spacing between two nearest p-type fins 106 disposed in neighboring SRAM cells 101. In some examples, the ratio of the width W7 to the width W1 may be at least about 1.5 and less than about half of the separation distance between the adjacent p-type fins 106. In some examples, half of the separation distance may be about 10 times the width W1. In other words, a ratio of the width of the protruding portion 152 to the width W1 is at least about 0.5. While other ratios may also be applicable to the present embodiments, a ratio W7/W1 of less than about 1.5 may not provide sufficient enlargement in contact area for the subsequently formed S/D contacts for any enhancement in device performance to be realized.

Figure 10A:
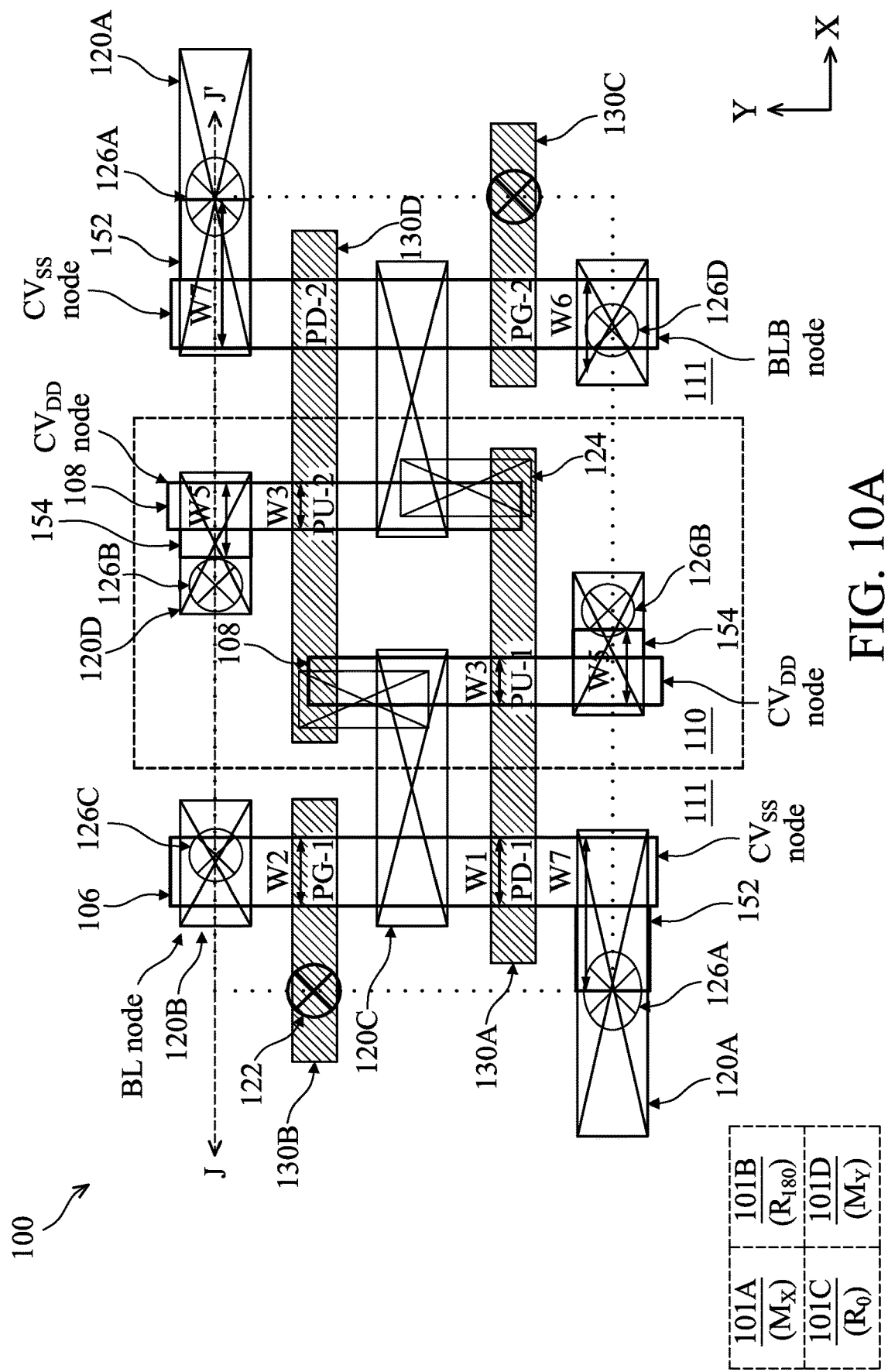
Figure 10B:
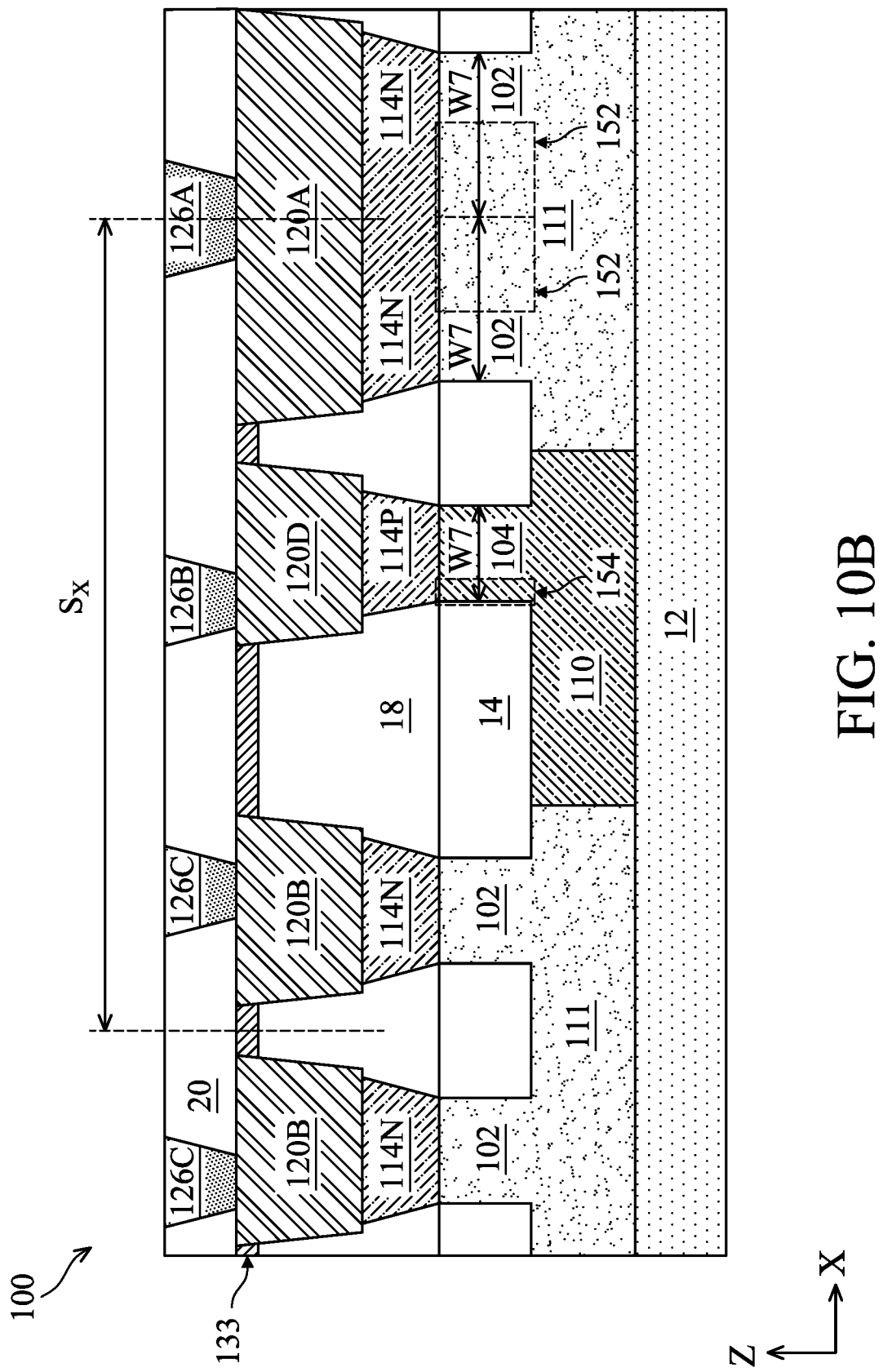
FIG. 10B is a cross-sectional view, in portion or entirety, of the IC structure taken along line JJ' of FIG. 10A according to various aspects of the present disclosure.

Further to the embodiments depicted in FIGS. 8A-9B, referring to FIGS. 10A and 10B, the width W5 of the portion of the n-type fin 108 configured to provide each source terminal of the PU-1 and PU-2 (further connected to the $CV_{DD}$ node) is greater than the width W3 of the stack of the channel layers 107 configured as the channel regions of the same devices, as discussed in detail above with respect to FIGS. 5A and 5B. Furthermore, such portion of the n-type fin 108 extends laterally toward an interior region of the SRAM cell 101, thereby defining a protruding portion 154 of the n-type fin 108 that extends, in its entirety, in a direction opposite to that of the protruding portion 152.

Still further to the embodiments depicted in FIGS. 8A-9B, referring to FIGS. 11A-12B, the width W6 of the portion of the p-type fin 106 configured to provide each source terminal of the PG-1 and PG-2 (and further connected to the BL and the BLB nodes, respectively) is greater than the width W2 of the stack of the channel layers 105 configured as the channel regions the same devices. In some embodiments, referring to FIGS. 11A and 11B, such portion of the p-type fin 106, depicted as protruding portion 156, extends unilaterally beyond the stack of the channel layers 105 toward the interior region of the SRAM cell 101, similar to that depicted in and discussed with respect to FIGS. 6A and 6B. In some embodiments, referring to FIGS. 12A and 12B, such portion of the p-type fin 106, depicted as protruding portions 158A and 158B, extends bilaterally beyond the stack of the channel layers 105, similar to that depicted in and discussed with respect to FIGS. 7A and 7B. In some examples, each SRAM cell 101 may include any one or more of the protruding portions 154, 156, and the combination of 158A and 158B in addition to the protruding portion 152.

Figure 13:
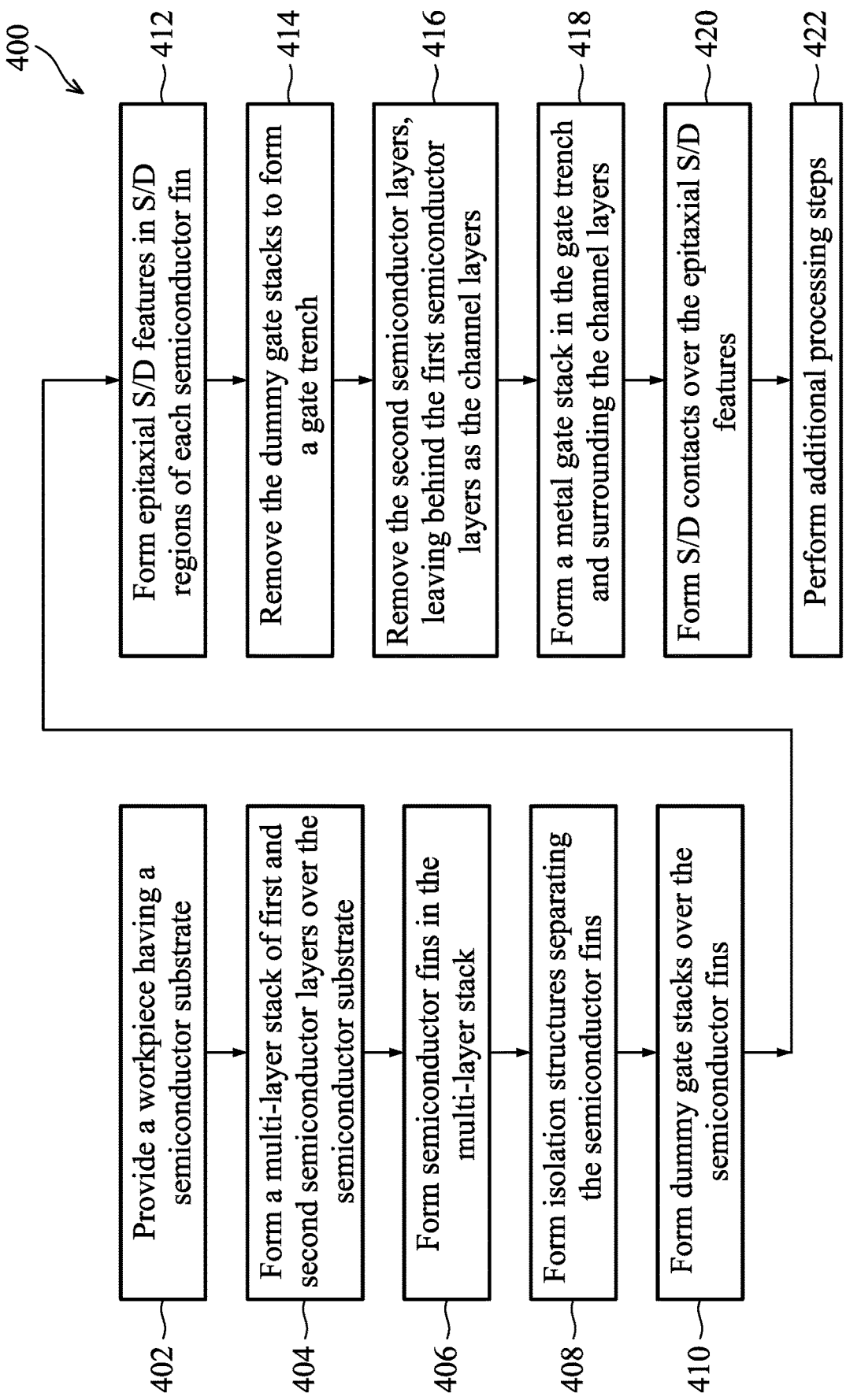
FIG. 13 is a flow chart of a method for fabricating an IC chip according to various aspects of the present disclosure.

FIG. 13 illustrates a processing flow of a method 400 for forming an embodiment of the SRAM array 100 or portions thereof as depicted in FIGS. 2A-12B in accordance with some embodiments of the present disclosure. The method 400 is merely an example and is not intended to limit the present disclosure beyond what is explicitly recited in the claims. Additional operations can be performed before, during, and after the method 400, and some operations described can be replaced, eliminated, or moved around for additional embodiments of the method. After completing various operations of the method 400, multiple channels layers are formed over each doped region, stacked vertically, and surrounded by gate stacks to form various GAA FETs.

At operation 402, the method 400 provides a workpiece, such as the IC structure 10, that includes the substrate 12 and various doped regions (e.g., n-wells 110 and p-wells 111) formed in or over the substrate 12. In the present embodiments, the substrate 12 includes silicon. Alternatively or additionally, the substrate 12 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. In some embodiments, the substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, other suitable methods, or combinations thereof.

Each n-well 110 may be doped with an n-type dopant, such as phosphorus, arsenic, other n-type dopants, or combinations thereof. Each p-well 111 may be doped with a p-type dopant, such as boron, indium, other p-type dopants, or combinations thereof. In some embodiments, the substrate 12 includes doped regions formed with a combination of p-type dopants and n-type dopants. The various doped regions can be formed directly on and/or in the substrate 12, for example, providing a p-well structure, an n-well structure, a dual-well structure, a raised structure, or combinations thereof. Each of the various doped regions may be formed by performing an ion implantation process, a diffusion process, other suitable doping processes, or combinations thereof.

At operation 404, the method 400 forms a multi-layer stack of semiconductor materials (hereafter referred to as the "multi-layer stack" for short) over the substrate 12. In the present embodiments, the p-type fins 106 and the n-type fins 108 are formed from the multi-layer stack at subsequent operations of the method 400. In the present embodiments, the multi-layer stack includes alternating layers of semiconductor materials (e.g., alternating layers of epitaxially grown Si and epitaxially grown SiGe) grown in a series of epitaxy processes. The epitaxy process may include CVD deposition techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process can use gaseous and/or liquid precursors, which interact with the composition of the underlying substrate. In some examples, the layers of the multi-stack may be provided in the form of nanosheets, nanowires, or nanorods. Subsequent processing may remove the second semiconductor layers (e.g., the SiGe layers), leaving behind the first semiconductor layers (e.g., the Si layers) in a suspending structure. Such a process, which will be discussed in detail below, may be referred to as the "wire release process" or "sheet formation process," depending upon the configuration of the layers in the multi-layer stack. In the present embodiments, the remaining stack of Si semiconductor layers become the channel layers, such as the channel layers 105 and 107 configured to form a GAA NFET or a GAA PFET in the SRAM array 100 as discussed in detail above.

At operation 406, the method 400 forms semiconductor fins (alternatively referred to as fin active regions), such as the p-type fins 106 and the n-type fins 108, in the multi-layer stack. Accordingly, the p-type fins 106 and the n-type fins 108 each include alternating layers of Si and SiGe as discussed above with respect to the multi-layer stack. In some embodiments, the IC structure 10 includes additional semiconductor fins (not depicted herein) each having a single-layer structure for providing a FinFET rather than alternating layers of different semiconductor materials for providing a GAA FET.

In the present embodiments, the p-type fins 106 and the n-type fins 108 may be fabricated by directly patterning the multi-layer stack. The fabrication process may include forming a masking element including a photoresist layer, lithographically patterning the masking element, and subsequently etching the multi-layer stack (and portions of the substrate 12) using the patterned masking element as an etch mask. The etching process may include dry etching, wet etching, reactive ion etching (RIE), other suitable processes, or combinations thereof. The resulting semiconductor fins may be doped with various dopants according to design requirements.

In the present embodiments, the direct patterning (or printing) process at operation 406 allows the p-type fins 106, and the n-type fins 108 in some instances (see embodiments depicted in FIGS. 5A, 5B, 10A, and 10B), to be formed to varying widths along the length of each fin. For example, in the depicted embodiments of FIGS. 2A, 2B, and 4A-7B, the portion of each p-type fin 106 corresponding to the as the channel region of each of the PD-1 and PD-2 is formed to the width W1, and the portion of each p-type fin 106 corresponding to the source terminal of each of the PD-1 and PD-2 is formed to the width W4. Similarly, in the depicted embodiments of FIGS. 8A-11B, the portion of each p-type fin 106 corresponding to the channel region of each of the PD-1 and PD-2 is formed to the width W1, and the portion of each p-type fin 106 corresponding to the source terminal of each of the PD-1 and PD-2 is formed to the width W6. As such, the present embodiments provide SRAM cells with enlarged landing area for source contacts corresponding to various nodes (e.g., the $CV_{SS}$ nodes) without substantially impacting the device density of the SRAM cells at advanced technology nodes. In some instances, as discussed above, forming the p-type fins 106 via direct patterning may cause regions (e.g., the channel region defined by the width W1) in the vicinity of an enlarged source region (e.g. the source region defined by the width W4) to be slightly wider than regions (e.g., the channel region defined by the width W2) far from such enlarged region due to the rounding effect of the lithographic patterning process.

Notably, in contrast to single-layer fin structures that are generally formed by one or more spacer patterning process (e.g., double or multiple patterning processes), semiconductor fins formed from the multi-layer stack (e.g., the p-type fins 106 and the n-type fins 108) may be directly patterned or printed, which allows adjustment of the fin width at desired locations along the fin length, thereby achieving the widening of portions of the p-type fins 106 (and the n-type fins 108 in some embodiments) that correspond to the source nodes of the PD-1 and PD-2 (i.e., the $CV_{SS}$ nodes).

At operation 408, the method 400 forms the isolation structures 14 to insulate various components formed over the substrate 12. The isolation structures 14 may include STI, field oxide, LOCal oxidation of silicon (LOCOS), other suitable features comprising silicon oxide, silicon nitride, silicon oxynitride, other suitable dielectric materials, or combinations thereof. The isolation structures 14 may be formed by any suitable method. In some embodiments, the isolation structures 14 are formed by filling trenches between the semiconductor fins with a dielectric material, followed by applying a chemical mechanical planarization (CMP) process and an etch-back process to the dielectric material to form the isolation structures 14. The isolation structures 14 may include a multi-layer structure, for example, having one or more thermal oxide liner layers.

At operation 410, the method 400 forms one or more dummy gate stacks (not depicted) over the semiconductor fins. The dummy gate stacks may include, for example, an interfacial layer (including, for example, silicon oxide) and a dummy gate electrode layer (including, for example, polysilicon) formed over the interfacial layer. After forming other components (e.g., the S/D features 114N and 114P), portions of each dummy gate stack (e.g., the dummy gate electrode layer) is removed to form a gate trench in which at least a high-k gate dielectric layer (e.g., the high-k gate dielectric layer 132) and a metal gate electrode (e.g., the metal gate electrode 134) are subsequently formed to complete the fabrication of each of the gate stacks 130A-130D. Various material layers of the dummy gate stacks may be first deposited as a blanket layer over the semiconductor fins and subsequently patterned, followed by one or more etching process, to form the dummy gate stacks in a desired configuration in the SRAM cells 101.

The top gate spacers of the GAA FETs, such as the top spacers 116A, may be formed on sidewalls of the dummy gate stacks at operation 410. The top spacers 116A may include silicon nitride, silicon oxide, silicon carbide, silicon carbide nitride, silicon oxynitride, silicon oxycarbide, silicon oxycarbide nitride, a low-k dielectric material, other materials, or a combination thereof. The top spacers 116A may be formed by first depositing a spacer layer over the dummy gate stacks and subsequently performing an anisotropic etching process to the spacer layer, leaving behind the top spacers 116A on the sidewalls of the dummy gate stacks.

At operation 412, the method 400 forms the n-type S/D features 114N and the p-type S/D features 114P in the S/D regions of each semiconductor fin. The n-type S/D features 114N may include epitaxially grown semiconductor material(s) such as epitaxially grown Si or SiC configured to form GAA NFETs, and may additionally include one or more n-type dopants, such as phosphorus or arsenic. The p-type S/D epitaxial features 114P may include epitaxially grown semiconductor material(s) such as epitaxially grown SiGe configured to form GAA PFETs, and may additionally include one or more p-type dopants, such as boron or indium. Each S/D feature may include one or more epitaxially grown semiconductor layers. The n-type S/D features 114N may be grown in p-type fins, such as the p-type fins 106, while the p-type S/D features 114P may be grown in n-type fins, such as the n-type fins 108. Forming the S/D features may include removing portions of each semiconductor fin in its S/D regions to form an S/D recess and subsequently performing a suitable epitaxy process (discussed in detail above with reference to the multi-layer stack) to form the S/D features. In some embodiments, annealing processes are performed to activate dopants in the S/D features and/or other S/D regions, such as HDD regions and/or LDD regions.

In the present embodiments, before forming the S/D features in the S/D recess, portions of the non-channel layers (e.g., the SiGe layers) of the multi-layer stack exposed in the S/D recess are selectively removed to form openings and a dielectric layer is subsequently deposited in the openings to form inner spacers, such as the inner spacers 116B. The inner spacers 116B may include silicon nitride, silicon oxide, silicon carbide, silicon carbide nitride, silicon oxynitride, silicon oxycarbide, silicon oxycarbide nitride, a low-k dielectric material, other materials, or a combination thereof. The inner spacers 116B may include a single-layered structure of a multi-layered structure. A composition of the inner spacers 116B may be similar to or different from that of the top spacers 116A, which has been discussed in detail above.

At operation 414, the method 400 removes the dummy gate stacks to form a plurality of gate trenches. Forming the gate trenches may include forming an ILD layer (e.g., ILD layer 18) over the S/D features and the dummy gate stacks. The ILD layer may include any suitable dielectric material that is generally different from the composition of the ESL 133. For example, the ILD layer 18 may include a low-k dielectric material, silicon oxide, doped silicate glass, other suitable materials, or combinations thereof, and may be formed by any suitable method, such as spin-on-glass or flowable CVD. A top surface of the ILD layer may be planarized using one or more CMP process.

At operation 416, the method 400 performs one or more etching process, such as a dry etching process and/or a wet etching process, to remove the non-channel layers (e.g., the SiGe layers) from the multi-layer stack, leaving behind the channel layers (e.g., the Si layers) in a suspending structure. In other words, after removing the non-channel layers, multiple openings are inserted within the stack of channel layers. In the present embodiments, the one or more etching process selectively remove the non-channel layers without removing or substantially remove the channel layers. In one such example, the one or more etching process includes applying a fluorine-containing etching gas.

At operation 418, the method 400 forms the gate stacks 130A-130D in the gate trenches as well as the openings formed between the channel layers. In the present embodiments, each gate stack 130A-130D includes at least the high-k gate dielectric layer 132 and the metal gate electrode 134. In the present embodiments, portions of the high-k gate dielectric layer 132 wrap around each channel layer, such that each gate stack 130A-130D engages with the plurality of channel layers in each GAA FET. The high-k gate dielectric layer 132 may include silicon oxide, silicon oxynitride, aluminum silicon oxide, a high-k dielectric material such as hafnium oxide, zirconium oxide, lanthanum oxide, titanium oxide, yttrium oxide, strontium titanate, other suitable dielectric materials, or combinations thereof. Though not depicted, each metal gate electrode 134 may further include a bulk conductive layer disposed over at least one work function metal layer. The bulk conductive layer may include Cu, W, Ru, Co, Al, Ti, Ta, other suitable metals, or combinations thereof. In some examples, each gate stack may include one or more work function metal layer of the same conductivity type or of different conductivity types. Examples of the work function metal layers may include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. Various work function metal layers may be first deposited and then patterned to satisfy different requirements of threshold voltage in different GAA FETs. Additional material layers may also be included in each gate stack, such as an interfacial layer, a barrier layer, a capping layer, other suitable materials layers, or combinations thereof. Various layers of the gate stacks may be deposited by any suitable method, such as chemical oxidation, thermal oxidation, ALD, CVD, PVD, plating, other suitable methods, or combinations thereof.

At operation 420, the method 400 forms the S/D contacts 120A-120D to interconnect various S/D features with the subsequently-formed MLI structures. In the present embodiments, the S/D contacts 120A-120D are disposed in the ILD layer 18. The S/D contacts 120A-120D may include any suitable conductive material, such as Cu, W, Ru, Co, Al, Ti, Ta, other suitable metals, or combinations thereof. Each S/D contact 120A-120D may further include a barrier layer comprising any suitable material, such as Ti, Ta, TiN, TaN, other suitable materials, or combinations thereof. Forming the S/D contacts 120A-120D may include implementing lithography processes and/or etching processes to form openings (trenches), such as contact openings, in the ILD layer 18 and through the ESL 133. Thereafter, the opening(s) are filled with one or more conductive materials by PVD, CVD, ALD, plating, other suitable deposition processes, or combinations thereof. Thereafter, any excess conductive material(s) may be removed by a CMP process, thereby planarizing a top surface of ILD layer 18 and a top surface of the S/D contacts 120A-120D.

In some embodiments, a silicide layer (not depicted) is formed over the S/D features in the contact openings before forming the S/D contacts 120A-120D. The silicide layer may be formed by first depositing a metal layer over the S/D features, performing an annealing process to allow the metal layer to react with the materials of the S/D features, and subsequently removing un-reacted portions of the metal layer to leave behind the silicide layer. The silicide layer may include nickel silicide, titanium silicide, cobalt silicide, other suitable silicides, or combinations thereof.

At operation 422, the method 400 performs additional processing steps including, for example, forming the MLI structure over the IC structure 10. As provided herein, the MLI structure may include a plurality of conductive features configured to interconnect various components of the SRAM cells 101 with additional features to ensure the proper performance of the IC structure 10. The MLI structure may include electrically conductive interconnect features, such as the vias 126A-126D and metal layers M1-M3, disposed in and/or separated by dielectric layers, such as the ESL 133 and the ILD layer 20. Each electrically conductive interconnect feature may Cu, W, Ru, Co, Al, Ti, Ta, other suitable metals, or combinations thereof. In some embodiments, a barrier layer comprising Ti, Ta, TiN, TaN, other suitable materials, or combinations thereof, may be formed in the opening before depositing the conductive material. Each dielectric layer may include a low-k dielectric material, silicon oxide, other suitable dielectric materials, or combinations thereof, and may be formed by spin-on-glass, FCVD, other suitable methods, or combinations thereof. Methods of forming the various interconnect structures may be similar to that of forming the S/D contacts 120A-120D as discussed above.

Although not intended to be limiting, one or more embodiments of the present disclosure provide many benefits to a semiconductor device and the formation thereof. For example, the present embodiments provide an array of memory cells, such as SRAM cells, in an IC structure, where each SRAM cell includes GAA NFETs, such as PD and PG transistors, formed over p-type fins and GAA PFETs, such as PU transistors, formed over n-type fins, and where each of the p-type fins and n-type fins includes a stack of semiconductor (channel) layers engaged with a gate structure. In the present embodiments, a width of a first portion of the p-type fin providing the source terminal of the PD device in each SRAM cell is greater than a width of a second portion of the p-type fin configured as the channel region of the same PD transistor. Furthermore, the present embodiments provide that the first portion protrudes laterally toward an adjacent SRAM cell. In some embodiments, the first portion of one SRAM cell merges with the first portion of an adjacent p-type fin in a neighboring SRAM cell. In some embodiments, in addition to the first and the second portions of the p-type fin having varying widths, the portions of the same p-type fin configured to provide the PG transistor also have different widths. For example, a width of a third portion of the p-type fin providing the source terminal of the PG transistor is greater than a width of a fourth portion of the p-type fin configured as the channel region of the same PG transistor. In some embodiments, in addition to the first and the second portions of the p-type fin having varying widths, the portions of the n-type fin configured to provide the PU device also have different widths. For example, a width of a first portion of the n-type fin providing the source terminal of the PU transistor is greater than a width of a second portion of the n-type fin configured as the channel region of the same PU device, where the first portion of the n-type fin protrudes laterally away from the nearest adjacent PG transistor. The present embodiments provide GAA FETs having enlarged S/D features at source terminals of various GAA FETs, leading to improved contact landing area for subsequently formed S/D contacts as well as increased processing speed of SRAM cells without enlarging the overall footprint of the cells.

In one aspect, the present disclosure provides an IC structure that includes a first SRAM cell and a second SRAM cell that is adjacent to the first SRAM cell, where a layout of the second SRAM cell is a mirror image of that of the first SRAM cell about a vertical cell boundary. In the present embodiments, the first SRAM cell includes a first pull-down (PD) device and a second PD device disposed over a first fin and a second fin, respectively, where a portion of the first fin and a portion of the second fin corresponding to a channel region of the first and the second PD devices, respectively, each include a first stack of semiconductor layers defined by a channel width W1, and a portion of the first fin and a portion of the second fin providing a source terminal of the first and the second PD devices, respectively, are each defined by a width W1' that is enlarged with respect to the channel width W1 by a width W2. Furthermore, in the present embodiments, the enlargement of the width W1' with respect to the channel width W1 extends laterally toward the second SRAM cell.

In another aspect, the present disclosure provides an SRAM cell as a part of an IC structure that includes a first pull-down (PD) device and a second PD device, a first pass-gate (PG) device and a second PG device, where the first PD device and the first PG device are disposed over a first fin and the second PD device and the second PG device are disposed over a second fin, a first pull-up (PU) device disposed over a third fin and a second PU device disposed over a fourth fin, the first and the second PU devices being cross-coupled with the first and the second PD devices, respectively. In the present embodiments, a first portion of the first and the second fins configured as a channel region of each of the first and the second PD devices, respectively, includes a stack of semiconductor layers defined by a width W1, and a second portion of the first and the second fins configured as a source region of each of the first and the second PD devices, respectively, includes a portion protruding beyond the first and the second PD devices' respective channel region and away from the first and the second PU devices, the second portion being defined by a width W2 that is greater than the width W1, where a source feature is disposed over the protruding portion of each of the first and the second PD devices.

In yet another aspect, the present disclosure provides an IC structure having a first SRAM cell that includes a first pull-down (PD) device and a first pass-gate (PG) device disposed over a first fin, a second PD device and a second PG device disposed over a second fin, a first pull-up (PU) device disposed over a third fin and cross-coupled with the first PD device, and a second PU device disposed over a fourth fin and cross-coupled with the second PD device. In the present embodiments, channel regions of the first and the second PD devices disposed in the first fin and the second fin, respectively, each include a stack of semiconductor layers defined by a channel width W1, and portions of the first and the second fins configured to provide source terminals of the first and the second PD devices, respectively, are each defined by a width W2 and include a first protruding portion that extends away from the first and the second PU devices, such that the width W2 is greater than the channel width W1. Furthermore, in the present embodiments, the IC structure further includes a second SRAM cell disposed laterally adjacent to the first SRAM cell, where a layout of the second SRAM cell mirrors a layout of the first SRAM cell about a cell boundary disposed therebetween. In the present embodiments, the second SRAM cell includes a third PD device disposed over a fifth fin, where a portion of the fifth fin configured to provide a source terminal of the third PD device includes a second protruding portion, and the first protruding portion of the first fin or the first protruding portion of the second fin extends to merge with the second protruding portion of the fifth fin. Still further, in the present embodiments, the IC structure includes a source feature disposed on each of the first and the second protruding portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit (IC) structure, comprising:
  a first static random-access memory (SRAM) cell, including:
    a first pull-down (PD) device and a second PD device disposed over a first fin and a second fin, respectively,
      wherein a portion of the first fin and a portion of the second fin corresponding to a channel region of the first and the second PD devices, respectively, each include a first stack of semiconductor layers defined by a channel width W1, and wherein a portion of the first fin and a portion of the second fin providing a source terminal of the first and the second PD devices, respectively, are each defined by a width W1' that is enlarged with respect to the channel width W1 by a first difference, wherein the first PD device and the second PD device each include an epitaxial source/drain feature over the source terminal; and a second SRAM cell disposed adjacent to the first SRAM cell, wherein a layout of the second SRAM cell is a mirror image of a layout of the first SRAM cell about a cell boundary disposed therebetween, and wherein the enlargement of the width W1' with respect to the channel width W1 extends laterally toward the second SRAM cell.

2. The IC structure of claim 1, wherein the enlargement of the width W1' with respect to the channel width W1 is a first enlargement, wherein the second SRAM cell includes a third PD device disposed over a third fin, wherein a portion of the third fin providing a source terminal of the third PD device includes a second enlargement with respect to a channel region of the third PD device, and wherein the second enlargement extends to merge with the first enlargement of the first fin or the second fin.

3. The IC structure of claim 2, wherein the epitaxial source/drain feature is further disposed on the second enlargement.

4. The IC structure of claim 1, wherein the enlargement of the width W1' with respect to the channel width W1 is a first enlargement, the first SRAM cell further comprising:

a first pass-gate (PG) device and a second PG device disposed over the first and the second fins, respectively, wherein a portion of the first fin and a portion of the second fin corresponding to a channel region of the first and the second PG devices, respectively, each include a second stack of semiconductor layers defined by a channel width W2, wherein a portion of the first fin and a portion of the second fin providing a source terminal of the first and the second PG devices, respectively, are each defined by a width W2' that is enlarged with respect to the channel width W2 by a second difference, and wherein a ratio of the second difference to the channel width W2 is less than a ratio of the first difference to the channel width W1.

5. The IC structure of claim 4, wherein the first SRAM cell further includes a first pull-up (PU) device and a second PU device disposed over a fourth fin and a fifth fin, respectively, wherein a portion of the fourth fin and a portion of the fifth fin corresponding to a channel region of the first and the second PU devices, respectively, each include a third stack of semiconductor layers defined by a channel width W3 less than the channel width W1, and wherein the enlargement of the width W2' with respect to the channel width W2 is a second enlargement, the second enlargement extending laterally toward the first and the second PU devices, respectively.

6. The IC structure of claim 5, wherein a portion of the fourth fin and a portion of the fifth fin providing a source terminal of the first and the second PU devices, respectively, are each defined by a width W3' that is enlarged with respect to the channel width W3 by a third difference, the third difference extending away from the first enlargement, and wherein a ratio of the third difference to the channel width W3 is less than a ratio of the first difference to the channel width W1.

7. An integrated circuit (IC) structure, comprising:
a static random-access memory (SRAM) cell, including:
a first pull-down (PD) device and a second PD device;
a first pass-gate (PG) device and a second PG device, wherein the first PD device and the first PG device are disposed over a first fin, and wherein the second PD device and the second PG device are disposed over a second fin;
a first pull-up (PU) device disposed over a third fin and a second PU device disposed over a fourth fin, the first and the second PU devices being cross coupled with the first and the second PD devices, respectively,
wherein a first portion of the first and the second fins configured as a channel region of each of the first and the second PD devices, respectively, includes a stack of semiconductor layers defined by a width W1, and
wherein a second portion of the first and the second fins configured as a source region of each of the first and the second PD devices, respectively, includes a portion protruding beyond the first and the second PD devices' respective channel region and away from the first and the second PU devices, the second portion being defined by a width W2 that is greater than the width W1, and
wherein the first PD device and the second PD device each include an epitaxial source/drain feature over the protruding portion.

8. The IC structure of claim 7, wherein the SRAM cell is a first SRAM cell, the IC structure further comprising a second SRAM cell disposed laterally adjacent to, and sharing a cell boundary with, the first SRAM cell, wherein a layout of the second SRAM cell is a mirror image of a layout of the first SRAM cell about the cell boundary, wherein the second SRAM cell includes a third PD device disposed over a fifth fin, wherein a portion of the fifth fin configured as a source region of the third PD device extends toward, but is separated from, the protruding portion of one of the first and the second PD devices.

9. The IC structure of claim 7, wherein the SRAM cell is a first SRAM cell, the IC structure further comprising a second SRAM cell disposed laterally adjacent to, and sharing a cell boundary with, the first SRAM cell, wherein a layout of the second SRAM cell is a mirror image of a layout of the first SRAM cell about the cell boundary, wherein the second SRAM cell includes a third PD device disposed over a fifth fin, wherein a portion of the fifth fin configured as a source region of the third PD device extends toward, and merges with, the protruding portion of one of the first and the second PD devices.

10. The IC structure of claim 7, wherein the stack of semiconductor layers is a first stack of semiconductor layers, wherein a third portion of the first and the second fins configured as a channel region of each of the first and the second PG devices, respectively, includes a second stack of semiconductor layers defined by a width W3, and wherein the width W3 is less than or equal to the width W1.

11. The IC structure of claim 10, wherein a fourth portion of the first and the second fins configured as a source region of each of the first and the second PG devices, respectively, laterally extends beyond the third portion, such that the fourth portion is defined by a width W4 that is greater than the width W3, and wherein a ratio of the width W4 to the width W3 is less than a ratio of the width W2 to the width W1.

12. The IC structure of claim 11, wherein the fourth portion, in its entirety, extends toward the first and the second PU devices.

13. The IC structure of claim 11, wherein the fourth portion partially extends away from the first and the second PU devices.

14. The IC structure of claim 7, wherein the stack of semiconductor layers is a first stack of semiconductor layers, wherein a first portion of the third and the fourth fins configured as a channel region of each of the first and the second PU devices includes a third stack of semiconductor layers defined by a width W5, wherein a second portion of the third and the fourth fins configured as a source region of each of the first and the second PU devices, respectively, extends away from the first and the second PD devices, respectively, such that the second portion of the third and the fourth fins are each defined by a width W6 that is greater than the width W5, and wherein the width W5 is less than the width W2.

15. The IC structure of claim 14, wherein a ratio of the width W6 to the width W5 is substantially the same as a ratio of the width W2 to the width W1.

16. The IC structure of claim 7, further comprising:
a first via coupling a source region of each of the first and the second PU devices to a first power supply voltage, the first via having a first area defined in a plane perpendicular to a stacking direction of the stack of semiconductor layers;
a second via coupling a source region of each of the first and the second PG devices to a bit line, the second via having a second area defined in the same plane as the first area; and
a third via coupling the source region of each of the first and the second PD devices to a second power supply voltage, the third via having a third area defined in the same plane as the first area, wherein the third area is greater than each of the first and the second areas.

17. An integrated circuit (IC) structure, comprising:
a first static random-access memory (SRAM) cell, including:
a first pull-down (PD) device and a first pass-gate (PG) device disposed over a first fin,
a second PD device and a second PG device disposed over a second fin,
a first pull-up (PU) device disposed over a third fin and cross-coupled with the first PD device, and
a second PU device disposed over a fourth fin and cross-coupled with the second PD device,
wherein channel regions of the first and the second PD devices disposed in the first fin and the second fin, respectively, each include a stack of semiconductor layers defined by a channel width W1, and
wherein portions of the first and the second fins configured to provide source terminals of the first and the second PD devices, respectively, are each defined by a width W2 and include a first protruding portion that extends away from the first and the second PU devices, such that the width W2 is greater than the channel width W1;
a second SRAM cell disposed laterally adjacent to the first SRAM cell,
wherein a layout of the second SRAM cell mirrors a layout of the first SRAM cell about a cell boundary disposed therebetween,
wherein the second SRAM cell includes a third PD device disposed over a fifth fin,
wherein a portion of the fifth fin configured to provide a source terminal of the third PD device includes a second protruding portion, and
wherein the first protruding portion of the first fin or the first protruding portion of the second fin extends to merge with the second protruding portion of the fifth fin; and
a source feature disposed on each of the first and the second protruding portions.

18. The IC structure of claim 17, wherein the stack of semiconductor layers is a first stack of semiconductor layers, and
wherein channel regions of the first and the second PG devices disposed in the first fin and the second fin, respectively, each include a second stack of semiconductor layers defined by a channel width W3, and wherein the channel width W3 is less than or equal to the channel width W1.

19. The IC structure of claim 17, wherein a ratio of the width W2 to the channel width W1 is at least about 1.5.

20. The IC structure of claim 17, wherein the stack of semiconductor layers is a first stack of semiconductor layers, wherein channel regions of the first and the second PU devices disposed in the third fin and the fourth fin, respectively, each include a third stack of semiconductor layers defined by a channel width W4,
wherein portions of the third and the fourth fins configured to provide source terminals of the first and the second PU devices, respectively, are defined by a width W5, wherein the width W5 is greater than the channel width W4.

* * * * *